US006919504B2

(12) United States Patent
McCutcheon et al.

(10) Patent No.: US 6,919,504 B2
(45) Date of Patent: Jul. 19, 2005

(54) FLEXIBLE HEAT SINK

(75) Inventors: Jeffrey W. McCutcheon, Baldwin, WI (US); Timothy N. Narum, Lake Elmo, MN (US); Philip P. Soo, Fullerton, CA (US); Yaoqi J. Liu, Maplewood, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/324,759

(22) Filed: Dec. 19, 2002

(65) Prior Publication Data

US 2004/0118579 A1 Jun. 24, 2004

(51) Int. Cl.$^7$ ................................. H05K 7/20
(52) U.S. Cl. ................................. 174/16.3
(58) Field of Search ............. 174/163; 357/81, 357/82, 79; 165/185

(56) References Cited

U.S. PATENT DOCUMENTS

| | | | | |
|---|---|---|---|---|
| 4,619,316 A | * | 10/1986 | Nakayama et al. | 165/104.33 |
| 4,663,649 A | * | 5/1987 | Suzuki et al. | 257/746 |
| 4,703,339 A | * | 10/1987 | Matsuo | 257/706 |
| 4,888,637 A | * | 12/1989 | Sway-Tin et al. | 174/252 |
| 4,894,060 A | | 1/1990 | Nestegard | |
| 4,900,877 A | | 2/1990 | Dubrow et al. | |
| 4,926,242 A | * | 5/1990 | Itoh et al. | 257/720 |
| 4,938,279 A | | 7/1990 | Betker | |

(Continued)

FOREIGN PATENT DOCUMENTS

| | | |
|---|---|---|
| EP | 1 122 779 A2 | 8/2001 |
| JP | 11-335562 | 12/1999 |
| WO | WO 96/06321 | 2/1996 |
| WO | WO 97/43352 | 11/1997 |
| WO | WO 99/25022 | 5/1999 |

OTHER PUBLICATIONS

Sagal et al., "Elastomeric Heat Sink". U.S. Appl. No. 10/222,574, claims allowed Dec. 13, 2004, pp. 1–2.

Campbell et al., Polymer Characterization, Physical Techniques, Chapter 8, X–ray diffraction, 1989, pp. 174–181.

Kraus et al., "Convective Optimizations", Design and Analysis of Heat Sinks, Chapter 9, 1995, pp. 239–271.

Hill, "Characterization and Performance of Thermally Conductive Epoxy Compound Fillers", SMTA National Symposium "Emerging Packaging Technologies", Research Triangle Park, NC, Nov. 18–21, 1996, pp. 125–131.

Chomerics Brochure, Heat Spreaders, "T–Wing® and C–Wing™ Heat Spreaders", Oct. 1999, pp. 51–56.

3M Brochure, "Thermally Conductive Adhesive Transfer Tapes 8805, 8810, 8815", 2002.

*Primary Examiner*—Chau N. Nguyen
(74) *Attorney, Agent, or Firm*—Dean M. Harts

(57) ABSTRACT

Provided is a flexible heat sink article comprising a base comprising a polymer and a plurality of polymeric protrusions extending away from the base, each protrusion having a major dimension and a minor dimension. The base comprises thermally conductive particles, and the protrusions comprise non-spherical thermally conductive particles substantially aligned in the direction of the major dimension within the protrusions. A thermal interface material may be provided contiguous with the base. Also provided is a flexible heat sink article comprising a base comprising a polymer and having a first surface and a second surface, a plurality of polymeric protrusions extending away from the first surface of the base, each protrusion having a major and a minor dimension, and a metallic layer contiguous with the second surface of the base, wherein the base and the protrusions comprise thermally conductive particles. Also provided is a method of making a flexible heat sink.

7 Claims, 8 Drawing Sheets

U.S. PATENT DOCUMENTS

| | | | |
|---|---|---|---|
| 4,999,741 A | | 3/1991 | Tyler |
| 5,006,924 A | * | 4/1991 | Frankeny et al. ............ 257/714 |
| 5,049,085 A | | 9/1991 | Reylek et al. |
| 5,077,870 A | | 1/1992 | Melbye et al. |
| 5,168,926 A | * | 12/1992 | Watson et al. .............. 165/185 |
| 5,248,748 A | * | 9/1993 | Nakamura et al. .......... 526/285 |
| 5,285,108 A | * | 2/1994 | Hastings et al. ............ 257/712 |
| 5,315,480 A | | 5/1994 | Samarov et al. |
| 5,366,688 A | | 11/1994 | Terpstra et al. |
| 5,430,609 A | | 7/1995 | Kikinis |
| 5,440,172 A | | 8/1995 | Sutrina |
| 5,443,876 A | | 8/1995 | Koskenmaki et al. |
| 5,513,070 A | | 4/1996 | Xie et al. |
| 5,523,049 A | | 6/1996 | Terpstra et al. |
| 5,523,260 A | | 6/1996 | Missele |
| 5,552,960 A | | 9/1996 | Nelson et al. |
| 5,572,070 A | | 11/1996 | Ross |
| 5,602,221 A | | 2/1997 | Bennett et al. |
| 5,620,795 A | | 4/1997 | Haak et al. |
| 5,653,280 A | | 8/1997 | Porter |
| 5,660,917 A | | 8/1997 | Fujimori et al. |
| 5,738,936 A | | 4/1998 | Hanrahan |
| 5,745,344 A | | 4/1998 | Baska et al. |
| 5,781,412 A | | 7/1998 | de Sorgo |
| 5,790,376 A | | 8/1998 | Moore |
| 6,026,895 A | | 2/2000 | Moresco et al. |
| 6,048,919 A | | 4/2000 | McCullough |
| 6,060,009 A | | 5/2000 | Welygan et al. |
| 6,093,961 A | | 7/2000 | McCullough |
| 6,106,922 A | | 8/2000 | Cejka et al. |
| 6,204,303 B1 | | 3/2001 | Osuna et al. |
| 6,280,845 B1 | | 8/2001 | Kollaja et al. |
| 6,348,654 B1 | | 2/2002 | Zhang et al. |
| 6,372,323 B1 | | 4/2002 | Kobe et al. |
| 6,385,047 B1 | | 5/2002 | McCullough et al. |
| 6,410,137 B1 | | 6/2002 | Bunyan |
| 6,465,561 B1 | | 10/2002 | Yarbrough et al. |
| 6,547,001 B2 | | 4/2003 | McCullough et al. |
| 6,616,999 B1 | * | 9/2003 | Freuler et al. ............. 428/40.1 |
| 6,680,015 B2 | | 1/2004 | McCullough |
| 2002/0018338 A1 | | 2/2002 | McCullough |
| 2002/0041487 A1 | | 4/2002 | McCullough et al. |
| 2002/0108743 A1 | * | 8/2002 | Wirtz ......................... 165/185 |
| 2002/0195232 A1 | | 12/2002 | Katsui |
| 2004/0226707 A1 | | 11/2004 | Sagal et al. |

* cited by examiner

FLEXIBLE HEAT SINK

TECHNICAL FIELD

This invention relates to flexible polymeric heat sink articles including those provided in a roll or tape form, as well as methods of making heat sink articles.

BACKGROUND

Heat sinks conduct thermal energy away from a heat-generating component to the environment by convection, radiation, or further conduction. Heat sinks usually have an extended surface area to improve heat dissipation to the environment. Aluminum (or other metal such as copper) extrusions are a common form of heat sink. These extrusions have a rigid base and extended surface area fins. The metal heat sinks are normally electrically conductive, and may contribute to electromagnetic interference problems in electronic devices. Other versions of metal heat sinks include flexible copper foils in various shapes, which optionally may have electrically insulating coatings on one or both major surfaces. Ceramics, metal, and sintered heat sinks are generally rigid.

Thermally conductive polymers have been used in heat exchangers, electronic devices, bipolar plates, and thermal interface materials. Injection molded heat sinks formed from high modulus thermoplastic or epoxy materials containing dispersed conductive particles have been described, as have composite heat sinks consisting of polymer fins laminated with metal foil. Non-metallic heat sinks can reduce interference problems with electromagnetic and radio frequency fields.

SUMMARY

Briefly, the present invention provides a flexible heat sink article comprising a base comprising a polymer and a plurality of polymeric protrusions extending away from the base, each protrusion having a major dimension and a minor dimension. The polymer of the base comprises thermally conductive particles, and the polymer of the protrusions comprises non-spherical thermally conductive particles substantially aligned in the direction of the major dimension within the protrusions. The flexible heat sink has a degree of flexibility in the base portion and optionally in the protrusions that extend from the base.

In another aspect, the present invention provides a flexible heat sink article comprising a base comprising a polymer and having a first surface and a second surface, a plurality of polymeric protrusions extending away from the first surface of the base, each protrusion having a major dimension and a minor dimension, and a metallic layer contiguous with the second surface of the base, and optionally a thermal interface material contiguous with the metallic layer, wherein the polymer of the base and the polymer of the protrusions comprise thermally conductive particles, and optionally wherein the thermal interface material has a surface commingled with the base; and optionally wherein the heat sink article is provided in a roll form.

In still another aspect, the present invention provides a method of making a flexible heat sink comprising providing a first polymer composition comprising a multiplicity of thermally conductive particles, providing a second polymer composition comprising a multiplicity of non-spherical thermally conductive particles, forming a heat sink base from the first and/or second polymer, and forming a multiplicity of elongated protrusions contiguous with the heat sink base from the second polymer and optionally also from the first polymer, and optionally providing a metallic layer contiguous with the second surface of the base, and optionally providing a thermal interface material contiguous with the base or the metallic layer, wherein the non-spherical thermally conductive particles are substantially aligned along the direction of elongation of the protrusions.

As used herein, "major dimension" means the largest of a particle's dimensions, e.g., diameter, length, width, cross-section, or thickness, and "minor dimension" means the smallest of a particle's dimensions. These dimensions can be directly measured or classified by known screening techniques or particle sizing equipment. "Substantially aligned" means the particles are aligned in a direction within +/−45° from an axis parallel to the major dimension to a greater extent than non-aligned or randomly-oriented particles, such as shown via X-ray diffraction without uniformly oriented reflections. In certain embodiments the alignment is even greater. "Substantially similar" means having a composition wherein at least about 85 wt % of the substantially similar compositions are identical and any variation between or among the substantially similar compositions comprises less than about 15 wt % of each polymer in the composition. Conversely, "dissimilar" in such context means that the compositions vary by more than about 15 wt %. "Substantially similar" composition may comprise identical materials although in different amounts.

The invention provides many advantages, some of which will now be described. The heat sink of the invention generally uses materials having bulk conductivity at least about 5 Watts/meter-Kelvin (W/mK), more preferably at least about 10, and in some aspects at least about 20, yet the heat sink surprisingly approaches the performance of aluminum heat sinks at polymeric protrusions heights below about 30 mm although aluminum has a bulk conductivity dramatically higher, about 200 W/mK. While the materials used in the flexible heat sink may have a particular bulk conductivity, alignment of the non-spherical thermally conductive particles used increases conductivity along the direction of orientation to levels above the bulk conductivity.

Another advantage of the present invention is in the flexibility of the heat sink. The base of the heat sink can be flexible, while the polymeric protrusions are also flexible or remain relatively rigid. Thus, the inventive heat sink can be adapted to conform to uneven surfaces of any practical scale from a rough surface to an uneven surface, and even to macroscopic chip dimensions.

The flexible base of the heat sink also allows the heat sink to be placed onto surfaces that are not perfectly coplanar so a single flexible heat sink article provides heat dissipation to more than one non-coplanar device. The flexibility also can provide a damping benefit that reduces shock and vibration of the components and/or the larger surface structure that the heat sinks are attached directly or indirectly to (i.e., a flexible heat sink provides damping to a chip device to which it is directly attached, and additional damping to the printed circuit board to which this chip having the heat sink is attached). The flexible heat sink also reduces noise transmission in contrast to aluminum heat sinks which can transmit sound much like a tuning fork when attached to a vibrating component.

The heat sink can be provided in a roll form (for example the flexible heat sink of FIG. 1A is shown in a roll of about 12 cm inner diameter), and then cut to any desired shape such as via die cutting. The heat sink may further comprise a thermal interface material layer, which may be a thermally conductive adhesive layer. The protrusion quantity, placement, size, and base thickness can be varied independently to accommodate uneven temperature regions of a heat source. In addition, webs, rails, fins, foils, sails, and the like, in any combination can be used to direct heat and air flow. The polymeric protrusions can be of constant or varying height(s) and/or shape(s). The polymeric protrusions and base, which may comprise an adhesive, can be made independently or simultaneously through various processes.

Other features and advantages of the invention will be apparent from the following detailed description of the invention and the claims. The above summary of principles of the disclosure is not intended to describe each illustrated embodiment or every implementation of the present disclosure. The figures and the detailed description that follow more particularly exemplify certain preferred embodiments utilizing the principles disclosed herein.

DETAILED DESCRIPTION

The present invention provides a flexible heat sink article comprising a base comprising a polymer and a plurality of polymeric protrusions extending away from the base, each protrusion having a major dimension and a minor dimension. The polymer of the base comprises thermally conductive particles, and the polymer of the protrusions comprises non-spherical thermally conductive particles substantially aligned in the direction of the major dimension within the protrusions. The primary direction of heat flow typically is associated with the major dimension of the protrusions. Thus, the particle alignment is used to improve heat sink efficiency by directing heat away from the heat source more rapidly than in random particle alignment. In one aspect, the thermal conductivity in a preferred direction of heat flow is at least about 5% greater, more preferably at least about 10% (or even greater), than the thermal conductivity in a direction normal to the preferred direction. In another aspect, the thermal conductivity in a preferred direction of heat flow is a factor of about 1.5 to about 5 greater (or even higher), than the thermal conductivity in a direction normal to the preferred direction.

Figure 1A:
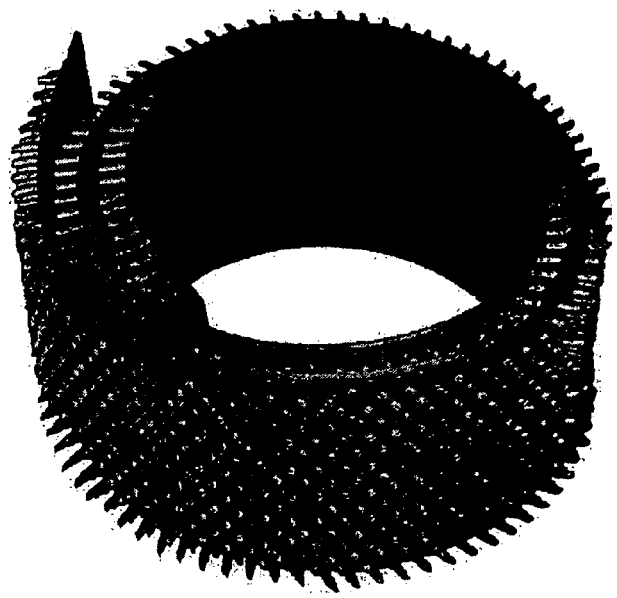
FIG. 1A is a perspective view of a heat sink article according to one embodiment of the present invention in roll form.
Figure 1B:
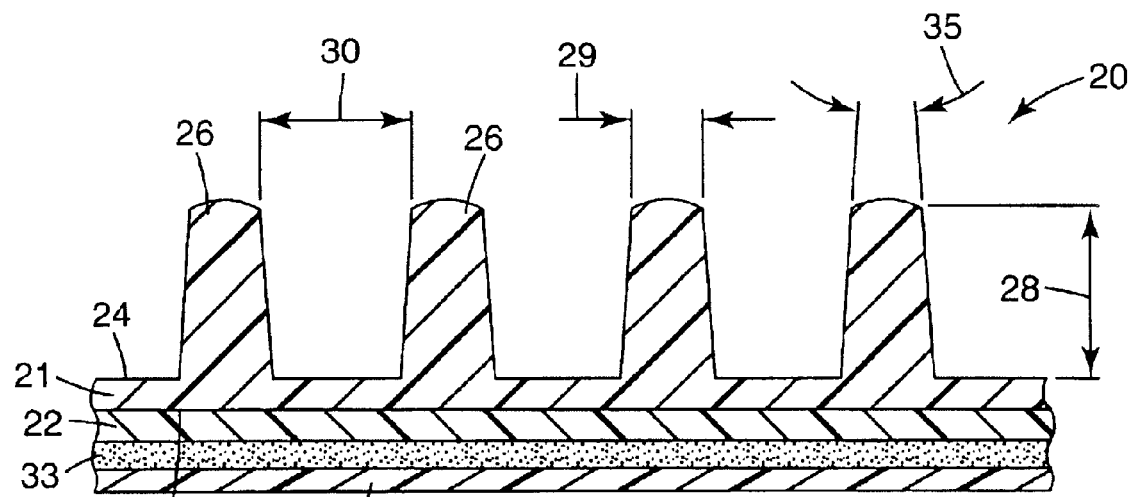
FIG. 1B is a side-sectional view of a heat sink article according to one embodiment of the present invention.

Referring now to FIG. 1B, shown is a side-sectional view of heat sink article 20 according to one embodiment of the present invention. Heat sink article 20 includes base 21 having first surface 24 with a plurality of polymeric protrusions 26. The polymeric protrusions may be arranged in a regular or an irregular array. The polymeric protrusions may be separate substantially vertical posts, cones, or extended rows or rails, or combinations thereof. The population of polymeric protrusions may be of different or varying heights and/or shapes. Any known layout can be used for the polymeric protrusions, such as hexagonal or other polygonal shapes, diagonal, sinusoidal, rails/posts with undercut features that resemble coniferous trees, etc.

Polymeric protrusions 26 and base 21 can be made from any known polymer, particularly melt processible or extrudable polymer. Suitable examples include thermoplastic polymers, elastomeric polymers, thermoset polymers, and thermoplastic elastomers. Two or more such materials may be used in combinations such as layers and blends. In addition, polymeric protrusions 26 and base 21 may comprise the same or different materials. The thermoset polymers can be crosslinked via any known means, such as via chemical or thermal agents, catalysts, irradiation, heat, light, and combinations thereof. In one aspect, the polymer has a glass transition temperature below about 25° C., more preferably below about 10° C. or even below about 0° C. That is, the polymer is not completely hard and glassy at room temperature.

In the embodiment of FIG. 1B, base 21 is integrally formed with polymeric protrusions 26 of a polymeric material, which may or may not be the same material as the protrusions. The polymer(s) for the protrusions and the base may be the same, similar, or different. In one aspect of the invention, the protrusions and the base are comprised of substantially similar polymer compositions. "Substantially similar" means having a composition wherein at least about 85 weight percent (wt %), more preferably at least about 90 wt %, and in some embodiments at least about 95 wt %, of the substantially similar compositions are identical. Any variation between or among the substantially similar compositions correspondingly comprises less than about 15 wt %, more preferably less than about 10 wt %, and in some embodiments less than about 5 wt %, of each polymer in the composition. Conversely, "dissimilar" in such context means that the compositions vary by more than about 15 wt %. The selection of particular thermally conductive particles and amounts thereof used in the protrusions and the base can be the same, similar, or different. This selection can vary independently from the polymer selection. In one aspect of the invention, the particular polymers and particles are the same or similar, which reduces manufacturing complexity.

The combination of base 21 and polymeric protrusions 26 can be referred to as a heat sink web. Polymeric protrusions 26 may have generally parallel sidewalls (e.g., cylindrical), or may have slight taper 35, which facilitates removal from a mold. The protrusions in FIG. 1B are shown with major dimension 28 (height) and minor dimension 29 (width, shown at minimum taper) and distance 30 between adjacent polymeric protrusions 26. That is, a height greater than the cross-sectional width. In one aspect, any desired two-dimensional shape can be used for the polymeric protrusions, such as straight and/or curved sidewalls leading to rectangular, triangular, trapezoidal, hemispherical, T, "Christmas tree", inverted anchor, and other profiles, which may be a combination of those specifically mentioned and optionally with undercut(s) features. In another aspect, any desired three-dimensional shape can be used for the polymeric protrusions, such as cylinder, cone, truncated cone, pyramid, truncated pyramid, hemisphere, truncated hemisphere, rectangle, square, hexagon, octagon, other polygonal shape, and the like. The skilled person recognizes which shape is suitable for a particular purpose, and which process is better suited to a particular shape. In addition, combinations of processes can be used for hybrid shapes.

One or more shapes can be used in heat sink article 20. Particular shape selection is guided by attributes including surface area, airflow around the shape(s), flexibility, conductivity, etc. The shape(s) may have tapered widths. The protrusion may terminate in any shape such as flat, round, wave, or irregular shape. The polymeric protrusions may have similar or different heights. The sides of the protrusion may be any shape compatible with the protrusion shape such as flat, convex, concave, or irregular shape. In addition, the protrusions may comprise posts with an expanded surface area top portion that is as least 10% wider, more preferably at least 15% wider, than the thinnest section of the protrusions. The top portion may be any known shape, such as a mushroom, nail, umbrella, hat, bulb, inverted airfoils, arrow, hook, double hook, or treble hook, independently with a convex or concave surface in addition to its overall shape, and the top portion may be symmetrical or asymmetrical. The added top portion feature can aid airflow around the heat sink, and add surface area to improve heat losses. Such protrusions can assist or direct flow of the cooling fluid (such as air, water, or other fluid) to increase the heat transfer efficiency or improve use of the cooling fluid flowing around the protrusions. The flow of the cooling fluid can be directed to pass more completely through a heat sink design to improve heat dissipation performance of the total heat sink design and provide system designers more flexibility in using cooling mediums. The features atop the protrusions also can be designed such that "fresh" cooling medium can be directed into specific portions of the heat sink design. Fresh cooling fluid (air, water, Fluorinert™ fluorinated fluids from 3M Company, St. Paul, Minn., etc.) can be directed into the middle (or any desired portion or area) of the heat sink design to refresh/replace escaping cooling medium. For example, in one aspect cooling fluid is directed such that a midpoint area of a heat sink design uses a cooling medium directed primarily from one flow direction, fresh medium is directed into the heat sink internal volume area (i.e., the volume shaped by the polymeric protrusions) as other cooling fluid that initially entered at the side face of the heat sink design escapes. This addition of fresh fluid can increase the overall flow of a cool cooling fluid to the heat sink and also can increase the pressure of the cooling fluid in the heat sink design. The higher overall flow of the cooling medium in the heat sink area improves overall heat transfer and heat sink performance. The fluid-directing tops of the polymeric protrusions also may be on protrusions that are higher than surrounding protrusions and may have features that extend over, around or above lower protrusions, which lower protrusions may or may not have these added features. Such design variations in the present invention provide a flexible heat sink with polymeric protrusions that primarily dissipate heat, other polymeric protrusions with top features that dissipate heat and direct cooling fluid flow to improve heat dissipation among the various types of polymeric protrusions selected in the particular design.

In one aspect of the invention, at least a portion of the polymeric protrusions also may take the shape of a mast with an extended sail. The sails may be included on a portion of some or all of the masts, and the sails can extend over and/or past the base of the flexible heat sink. The sails increase surface area and heat loss. In one aspect, sails are not directly connected to the base and thus do not adversely affect the flexural rigidity of the heat sink.

In another aspect, the polymeric protrusions of the present invention have additional features such as being fluted, dimpled, recessed, and/or ribbed. These features can be designed to modify fluid flow around the protrusions. For example, the added surface features can increase turbulence. More turbulent flow improves heat transmission from the heat sink protrusions to the surrounding cooling fluid. The added features can also increase the heat transfer surface area for a given protrusion type.

Any known thermally conductive particles can be used in the present invention. These include carbon black, diamond, carbon fibers, carbon fibers coated with a metal or other conductive material such as nickel, ceramic fiber mesh, ceramics which includes for example: boron nitride, aluminum oxide, silicon carbide, aluminum nitride, aluminum trihydrate, magnesium hydroxide, metals such as aluminum, iron oxides, copper, stainless steel, etc., including metal foils. Suitable particles can vary by size, type (such as crystal forms of hexagonal, rhombohedral, cubic, etc.), agglomerated particle size, aspect ratio, surface coatings that enhance surface physical properties of the particles, pH characteristics (e.g., acidic, basic, including Lewis acid or Lewis base particles), and particle blends. Hollow, solid, or metal-coated particles may be used. Of course, the foil and/or mesh materials are provided as particles rather than sheets in polymeric protrusions 26, while such sheets or scrims additionally can be used in base 21. Particles may also be chosen to absorb or reduce interference at electromagnetic and/or radio frequencies (EMI/RFI). Such particles include iron oxides and nickel-coated particles. The polymeric protrusions and/or base may include a scrim, which is optionally selected from nickel or nickel-coated scrims, carbon scrims, nickel-coated carbon scrims, and combinations thereof. The size of the particles is selected to provide thermal conductivity, adequate distribution within the polymer (preferably uniform), as well as particle alignment. Particular selections and alignment details are described later. In one aspect, particles with a major dimension of at least about 5 micron ($\mu$m) are used. Non-spherical or elongated particles are aligned along the major dimension of the polymeric protrusions. These particles have an aspect ratio greater than about 1 to 1 (major dimension to minor dimension), more preferably greater than about 1.25 or even 1.5 to 1. In other aspects, the elongated particles have an aspect ratio greater than about 2 to 1, more preferably greater than about 5 to 1, 10 to 1, or even greater.

Polymeric protrusions 26 also can be flexible. In one embodiment, the protrusions are capable of being deflected by at least about 50% of the thickness (at the thinnest region) of the protrusions away from a center line of the protrusions without breaking, cracking, or plastically deforming, when the deflection occurs at the thinnest area of the protrusion. That is, a particular embodiment of a conical protrusion can be deflected more in a tip region having a smaller thickness (diameter if circular crosssection) than in a base portion having a greater thickness (e.g., diameter).

The polymeric protrusions can be any useful size. The minimum useful size dissipates heat from a heat-generating surface. Generally a minimum height is at least about 0.5 mm, more preferably at least about 0.7 mm or even 1 mm. The maximum height may be limited by such factors as the intended application, roll format, ease of manufacturing, heat dissipation, and flexibility (e.g., very tall flexible protrusions may bend over and limit flow of cooling fluid while shorted protrusions would remain substantially vertical). Generally a maximum height is below about 30 mm in some embodiments, more preferably below about 20 mm or even 15 mm. As the conductivity of the materials used in the heat sink increases, the maximum useful height of the polymeric protrusions increases and heights above 30 mm are useful. Polymeric protrusion dimensions and spacing preferably are designed for optimal heat transfer, with increasing surface area generally increasing heat flow until a maximum is reached. Similarly, more polymeric protrusions per unit base area generally increases heat flow until a maximum is reached. Generally the distance between the protrusions for cooling fluid flow is at least about 0.5 mm, more preferably at least about 1 mm.

In one embodiment, a heat sink useful in low-power applications preferably has polymeric protrusions with a maximum height of up to about 15 mm, independently a maximum post diameter of up to about 10 mm, and also independently a spacing between posts of up to about 7 or 8 mm. At smaller dimensions the thermal performance suffers and at larger dimensions the performance does not improve much while it requires more raw materials thereby increasing cost. More design detail is found in "Design and Analysis of Heat Sinks," by Kraus and Bar-Cohen, John Wiley and Sons, Inc., New York (1995), pp. 239–271.

Generally the protrusions extend above the base at least one-half the thickness of the base. The ratio of base thickness to protrusion height is selected from at least 0.5:1, at least 1:1, at least 1:2, at least 1:3, at least 1:6, and at least 1:8.

Polymeric protrusions 26 comprise non-spherical particles. These particles are elongated and are substantially aligned along the direction of the major dimension within each protrusion. Examples of higher aspect ratio particles include fibers, rods, needles, whiskers, ellipsoids, and flakes.

As bulk conductivity of the polymer blend increases, taller protrusions aid heat dissipation. As the alignment of non-spherical particles increases, conductivity along the alignment direction increases and the particle density can be increased and this further improves heat dissipation. For example, thermal conductivity along the x-y plane of a boron nitride platelet is greater than through the thickness (z-direction) of the platelet. Thermal conductivity of the z-direction of the boron nitride hexagonal crystal structure is 2.0 W/mK, while the thermal conductivity in the x-y plane is 400 W/mK, as described in "Characterization and Performance of Thermally Conductive Epoxy Compound Fillers," R. F. Hill, SMTA National Symposium "Emerging Packaging Technologies," Research Triangle Park, N.C., Nov. 18–21, 1996. Orientation can be improved by various means such as reducing the viscosity of the polymer matrix, using higher aspect ratio particles such as fibers, increasing shear during melt forming, and using combinations of different particle types such as platelets and/or fibers along with generally spherical particles to improve conductivity as well as improve alignment. The orientation can be shown by any known method, for example, x-ray diffraction.

Figure 16:
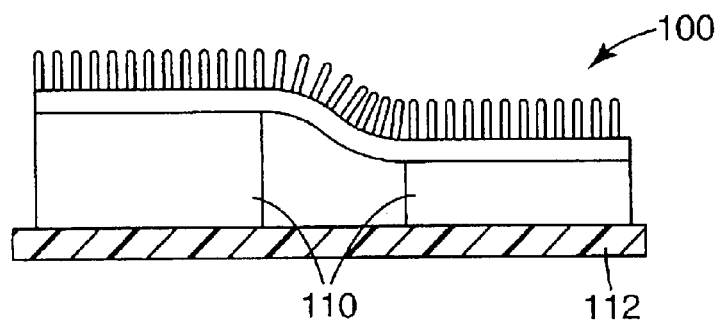
FIG. 16 shows a side view of a heat sink of an aspect of the invention conforming to various chip heights.

Base 21 may include one or more features selected to modify the flexibility of the base. For example, indentations, slits, channels, cut-outs, notches, holes, through holes, hinges, areas of differing thickness, or any combination thereof can be used to increase the flexibility of the base. The base flexibility can be varied by direction and with different designs. For example, the flexibility can be higher in one direction based on the design of the protrusions in single, monolithic elements, or elements that have greater height than width to provide different flexural rigidity due to the design of the protruding members. The flexural rigidity also can vary across heat sink article 20 in any direction, and with a plurality of protrusion aspect ratios, curvatures, waviness, different overall heights from the base, etc. FIG. 16 shows one embodiment in which heat sink 100 flexibly conforms to chips 110 of various heights on circuit board 112. While chips 110 are shown relatively flat, the heat sink of the present invention conforms to typical commercial chips with concave and convex surfaces.

Figure 17:
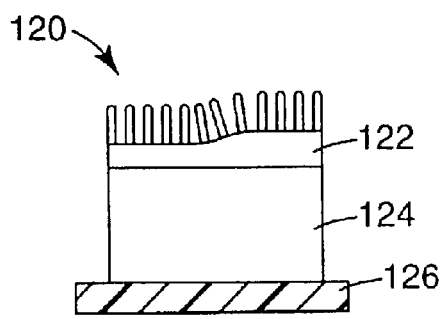
FIG. 17 is a side view of a heat sink article according to one embodiment of the present invention.
Figure 18:
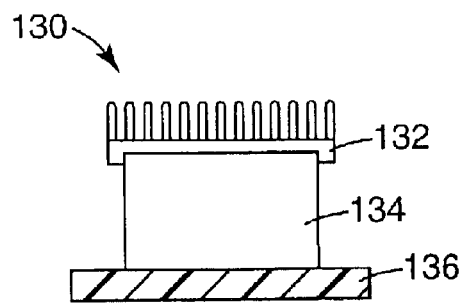
FIG. 18 is a side view of a heat sink article according to one embodiment of the present invention.
Figure 19:
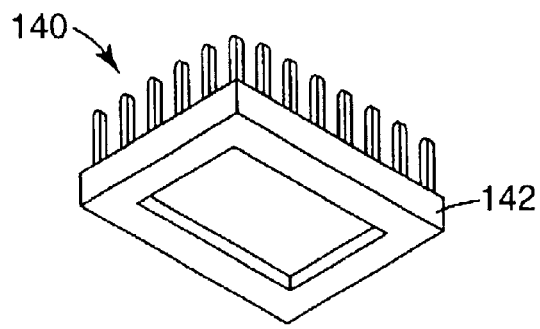
FIG. 19 is a perspective view of a heat sink article according to one embodiment of the present invention.

In the embodiment shown in FIG. 17, heat sink base 122 is adapted for chip 124 on circuit board 126. Heat sink 120 has a thinner base region contiguous with a lower-power region of chip 124, and heat sink 120 has a thicker base region contiguous with a higher-power region of chip 124. In the embodiment shown in FIG. 18, heat sink 130 is shown with base 132 adapted to contact a shaped surface. In the example shown, circuit board 136 has an exposed or packaged chip 134 which is set into base 132, or base 132 may have a cavity adapted to accept at least a portion of a chip or packaged device. In another aspect shown in FIG. 19, base 142 can extend beyond the top surface of a chip or packaged device, and optionally around at least a portion of one or more sides of the chip or packaged device. The heat sink base can be corrugated or include a corrugated layer. The heat sink base can include a textured or contoured surface, such as to accommodate a selectively non-uniform surface or one or more additional layer(s), such as a backing layer.

Referring to FIG. 1B, further layers (e.g., 22, 33 36) are optionally applied to second surface 25 of base 21. Backing layer 22 can provide further functionality, such as to stabilize and/or reinforce heat sink article 20, to resist stretching and improving tear resistance, as well as a variety of other functions. Backing layer 22 can, for example, be an adhesive or a thermal interface material, which itself can be an adhesive. Optional backing layer 33 may be used for a similar purpose, in which case backing layer 22 can be a reinforcing layer.

Backing layer 22 and/or 33 can be provided for attaching heat sink article 20 to a surface of a heat-generating device. When the attachment is an adhesive bond, release liner 36 can be used. For example, release liner 36 can be used when a roll of heat sink article 20 is wrapped about itself. Thus, the backing layer(s) can include one or more layers supporting the polymeric protrusions. In some embodiments, one or more backing layer(s) can be integral with the polymeric protrusions. Any known formation process can be used for the backing, e.g., coextrusion, coating, and lamination.

The optional adhesive layer typically comprises a material selected to provide a bond to a heat generating device or a substrate upon which a heat-generating device is mounted. Any known adhesive type can be used, such as pressure sensitive, thermosetting, thermoplastic, hot melt, or other thermal bond film, radiation-cured or curable, solvent-activatable or solvent-activated, low surface energy adhesive, and combinations such as stripes, islands, or layers thereof. Any known adhesive chemistry can be used, such as epoxy, urethane, synthetic rubber, natural rubber, polyolefin, silicone, ionomer, cyanate ester, acrylic and combinations, intermittent regions, or layers thereof. For example, regions of a high-tack adhesive may be intermittent with regions of a high thermal conductivity thermal interface material such as described herein. The adhesive may include one or more known additives, usually included for a particular purpose such as reinforcing filaments, and thermally conductive particles. Examples of additives include flame-retardants, plasticizers, tackifiers, processing aids, antistatic agents, and oils. Useful flame-retardant additives include halogenated and non-halogenated organic compounds, organic phosphorus-containing compounds (such as organic phosphates), inorganic compounds, and inherently flame-retardant polymers. These additives are added to or incorporated into the adhesive to improve the flame-retardant properties. The nature of the flame-retardant additive is not critical and a single additive or a mixture of two or more individual flame-retardant additives can be used. Detailed explanations of such flame-retardant additives are provided in U.S. Pat. No. 6,280,845, the disclosure of which is herein incorporated by reference. In selected aspects, the level of such flame-retardant additives is set to provide a flammability rating meeting UL-94 rating V1 and/or V0.

Backing layer 22 optionally can be laminated or impregnated with the adhesive. Depending upon the application, the adhesive may releasably bond or permanently bond the heat sink article to a surface. Releasably bonding adhesives include, for example, materials that are reworkable, heat-releasable, stretch-releasable, solvent-releasable, and the like.

The optional thermal interface material layer may comprise a phase change material, grease, or a eutectic alloy phase change material. The phase change material is a wax base (typically paraffin wax) with thermally conductive fillers. The grease can be hydrocarbon-based or silicone-based. The eutectic alloy is a metal alloy with a relatively low phase change or melting temperature. It can be made of materials such as tin, indium, lead, cadmium, bismuth, gold, silver, copper, etc. in various combinations to provide the desired rheology properties across the temperature range of the end use application and the desired manufacturing application method. The thermal interface material can be provided in intermittent regions of the same material, or in intermittent regions of two or more materials. The base and/or thermal interface material may be provided with caliper variations. For example, such caliper variations can modify one or more properties selected from heat flow, adhesion, surface wet-out, contact area, and flexibility. Generally, improvements in one or more of these properties are desired. In one aspect, the base has thinner regions in the vicinity beneath the polymeric protrusions and thicker regions between the polymeric protrusions such that overall base flexibility is maintained while thermal conductivity to the polymeric protrusions is increased. In such an embodiment, the thermal interface material can accommodate caliper variations in the underside of the base to provide an overall smooth surface for contacting a heat-generating component. This can improve thermal flow by providing thin regions that allow greater heat flow from a heat source and thicker regions that provide greater mechanical peel adhesion.

The flexible heat sink of the present invention also reduces stress generated by any differences in the coefficient of thermal expansion (CTE) between the heat sink and the structures to which it is attached. For example, the CTE of the inventive heat sink may be larger than the CTE of the package to which the heat sink is attached. Since stress is the product of the CTE times the modulus, the low modulus of the inventive flexible heat sink reduces stress. In addition, the damping characteristics described above (or viscoelastic behavior described below) allow stress to be relaxed over time, which cannot be achieved in the known metallic heat sink articles.

The Young's modulus of the polymer used in the flexible heat sink base and/or polymeric protrusions when measured at 70° F. (21° C.) is typically less than 100,000 psi (689 MPa), preferably less than 40,000 psi (276 MPa) and most preferably less than 15,000 psi (103 MPa). For comparison, the modulus of aluminum is approximately 10,000,000 psi (68,950 MPa).

The flexibility of the inventive heat sink allows bending to a radius of less than about 30 cm, more preferably below about 10 cm (and in some embodiments below about 5 cm or even lower) at room temperature without significantly adversely affecting the heat sink function. That is, the heat sink does not crack, kink, or significantly plastically deform to a shape that may leave a gap between the heat sink and the heat-generating substrate whereas aluminum heat sinks will permanently bend or kink. In another aspect, a heat sink sample having a 1- to 3-mm thick base will conform to a radius below about 30 cm with a force easily applied by an unaided person, preferably below about 350 kPa, more preferably below about 175 kPa, and most preferably even lower. Such conformable heat sinks having a 1- to 3-mm thick base have a stiffness below about 100,000 N/m. The heat sink of the invention preferably has a low level of elastic recovery force such that the heat sink does not "spring back" once applied.

The flexural modulus (using a single cantilever beam method such as ISO-6721-1) of the polymer mixed with thermally conductive filler(s) used in the flexible heat sink when measured at 70° F. (21° C.) is generally below about 10 GPa, more preferably below about 7 GPa, and in some embodiments below about 5, 1, or even below about 0.5 GPa. Two prototype heat sinks of the invention were measured. A more flexible heat sink had a flexural modulus of about 47 MPa (and Tg of −16° C.) and a less-flexible heat sink had a flexural modulus of about 3400 MPa (and Tg of −60° C.). Stiffness is another measure of flexibility useful for the present invention. Stiffness generally increases with the thickness cubed, so materials having lower flexural modulus can be used to form thicker bases while preserving heat sink flexibility. The stiffness of the base in the invention (1 to 3 mm thickness) is preferably below about 100,000

N/m, more preferably below about 50,000, 40,000, 30,000, or even below about 20,000 N/m. In other embodiments, the stiffness of the base material is below about 10,000 N/m, more preferably below about 5, 1, or even 0.5 N/m. In contrast, a comparison polymeric heat sink base (2.9 mm thickness) had a stiffness over 400,000 N/m and a flexural modulus of about 7400 MPa (and Tg of over 90° C.), and a comparison aluminum heat sink base (1.9 mm thickness) had a stiffness of over 550,000 N/m and a flexural modulus of about 95 GPa. The posts were removed before testing the mechanical properties.

The damping loss factor (a measure of how effective a material is in dissipating vibration, shock energy, sound, and the like) of the polymer used in the flexible heat sink base and/or polymeric protrusions when measured at 70° F. (21° C.) can vary depending on the end use design and the degree that the heat sink is used to add vibration and/or shock damping to the structure to which the heat sink is attached. For added damping at the typical operating temperature of the heat sink when attached to the end use structure, the loss factor is typically greater than about 0.01, preferably greater than about 0.10 and most preferably greater than about 0.30. For comparison, the loss factor of aluminum is approximately 0.001 at room temperature. The heat sink of the invention typically does not amplify or transmit vibrations, buzzing, or other sounds from adjacent components.

Another benefit of the inventive heat sink is the ability to resist mechanical damage to itself and the structure to which it is attached. The flexibility of the polymeric protrusions and the base of the flexible heat sink design allow bending or flexing, deflecting, and/or absorbing forces (e.g., impact force, shock force, vibration force with variable energy and duration). For example, a shock force is not well transmitted to the heat-generating device to which the heat sink is attached and any damage to the heat sink and device can be minimal. The heat sink can act as a vibration damper or shock isolator to the device to which it is attached, in drastic contrast to comparative heat sink designs of metal, which can transmit all forces to the heat-generating device. At a desired temperature and frequency (e.g., 70° F. (21° C.) and 500 Hz), the transmissibility of the shock, vibration, and/or impact force(s) using the flexible heat sink is reduced by at least about 10%, preferably at least 25%, and more preferably by at least about 50% as compared to a comparative aluminum heat sink of similar geometry when each is subjected to the same force. For example, a pendulum with a known weight can supply a known amount of impact energy to a portion of the protrusions of a heat sink and the amount of energy transmitted to the structure is measured via any known means. The plastic deformation of the protrusions due to the impact is measured. Damage to the heat-generating structure to which the heat sink is attached (e.g., chip cracks, stress, delamination of the base from the structure, etc.) and the ability of the heat sink to resist repeated impacts are measured. The heat sink of the present invention is robust and will not be easily damaged (permanent plastic deformation) by an impact forces encountered in manufacturing and/or use environments. In one aspect, the inventive heat sink can rebound from an impact force, preferably to within 50% of the original X-Y-Z volume location (preferably within 25%, and more preferably within 10%). The inventive heat sink will not easily damage components or structures it may contact accidentally, and it will not pass significant amounts of the mechanical energy of most impact forces to the structure to which it is attached. In addition, if damage does occur, it likely will be localized on the flexible heat sink.

The inventive heat sink can be installed with less risk of damaging a heat-generating device as the flexible heat sink can conform to the device dimensions, and elastically deform or deflect under excess installation force rather than transmitting any excess forces to the device. In contrast, known heat sinks are rigid and transmit these forces, and present much greater risk of device damage.

Improved surface wet-out is another advantage of the present invention. The inventive heat sink can conform to flat, non-flat, undulating, or other surfaces and provide a good thermal interface independent of the heat-generating device surface flatness. Generally, a transparent test substrate is used to determine the wet-out attribute. Examples of test substrates include flat glass and watch glasses of various diameters. In one aspect, the combination of base thickness and adhesive and/or thermal interface material thickness is selected to provide a substrate surface wet-out of at least about 40%, more preferably at least about 70%. In other embodiments, the combination of base thickness and adhesive and/or thermal interface material thickness is selected to provide a substrate surface wet-out of at least about 80%, 90%, or even 99%.

A preferred interface traps a minimum amount of air or voids and provides intimate contact between the surface interfaces. The flexibility and surface conforming features of the inventive heat sink allows using much thinner thermal interface materials (tapes, pads, epoxies, greases, pastes, alloy phase change materials, phase change materials, etc.) between the heat sink base and a heat-generating surface. A thinner thermal interface material reduces thermal impedance between the heat-generating structure and the flexible heat sink, while maintaining intimate contact between the flexible heat sink and the heat-generating structure. Traditional heat sinks of extruded aluminum typically have flatness in the range of 0.001 to about 0.005 inches per inch length (0.025 to 0.127 millimeter (mm) per mm length) as measured by total indicated runout (TIR). The non-flatness, the manufacturing variability that can exist from heat sink to heat sink, and the inherent rigidity of traditional non-flexible heat sinks mandates a thicker thermal interface material to ensure that the gap caused by the non-flat heat sink is filled with thermal interface material. The flexible heat sink design overcomes this disadvantage through flexibility and conformability and it easily can be flattened or smoothed to mate exceedingly well to the surface of a heat-generating structure. If the structure surface is not flat (e.g., plastic or ceramic packages of common chip devices can have a TIR of 1–9 mils (0.025 to 0.229 mm) in concave or convex shapes) the conventional high-modulus aluminum extruded heat sink requires an ever thicker interface material, or a very conformable interface material (such as an epoxy or grease) to fill the non-uniformity between the non-flat rigid heat sink and the non-flat structure. Of course, such thick thermal interface material regions come with higher thermal impedance.

The thermal interface materials (e.g., epoxies, greases, phases change materials, pastes, tapes, etc.) add material cost and manufacturing complexity to the overall system cost of providing heat sinks on heat-generating structures. The greater the non-flatness of the heat sink and structure it is to be applied to, with a non-flexible traditional heat sink requires a greater volume of thermal interface materials to ensure that the gaps are filled. Thicker thermal interface materials also have disadvantages in addition to the higher thermal impedance. For example, greases are messy and can contaminate the structure and heat sink surfaces, and may still need clips, screws, or other mechanical means to hold the heat sink. Thus, a typical extruded aluminum heat sink requires a greater volume of thermal interface material (and the concomitant lower thermal impedance) as compared to the inventive flexible heat sink to achieve a comparable surface wet-out.

Filling gaps with thermal interface material also increases the possibility of trapped air between the heat sink and the heat-generating structure, which also reduces thermal conductivity. More specifically, air has a thermal conductivity of about 0.02 W/mK, while many thermal interface materials range from about 0.1 W/mK to about 20 W/mK or even higher. Thus, air in the interface between the heat sink and the structure increases thermal impedance. The flexible heat sink of the present invention minimizes this concern as it conforms to the heat-generating surface and minimizes gaps.

The degree of wet-out versus thermal impedance at the interface also can vary. Assemblies using the flexible heat sink without an additional thermal interface material may have a lower wet-out percent (versus those with an interface material), but could still work acceptably in lower power applications because the heat flow is gradual. Typically, the percent wet-out desired for an assembly depends on factors including: (1) chip power density in Watts/in$^2$; (2) desired operating temperature of the chip or heat-generating item being cooled; and (3) cooling medium type, temperature, and flow rate across the heat sink protrusion design. Assuming that the cooling medium flow and temperature are fixed, it is found that as the power of the chip increases, the effect of the degree of wet-out at the interface between the base of the heat sink and the structure become more important in terms of overall thermal flow across the interface base area that could potentially be in contact with the structure being cooled (or heated). As power density increases, the percent wet-out can become more important. Reasons for using the flexible heat sink of the invention without a secondary thermal interface material added include: (1) potential for lower cost construction; (2) for lower power density applications, the degree of wet-out achieved with-out an interface material can meet the desired operating temperature range of the system. Using more conformable polymers in the heat sink base of the invention can reduce or minimize (or even eliminate) the thickness of the thermal interface material and thus lower the direct cost of the flexible heat sink. For example, a soft polymeric material such as a silicone or fluoropolymer elastomer can be used as the base material that is in direct contact with the heat-generating structure. The entire heat sink article of the invention also can use the silicone or fluoropolymer elastomer as the polymer. This design may need an additional mechanical clip, scrim, or web to hold it in place and under a degree of pressure to ensure good interface contact is maintained in the application. The degree of wet-out can vary with compressive pressure, which will typically be in the 2–50 psi range (13.8 to 345 MPa) or more. This design can include an adhesion level within the material sufficient to hold the heat sink in place.

For example, a typical extruded aluminum heat sink with a base that is about 1.5 by 1.5 inches (38×38 mm) and has a TIR of about 0.002 to 0.003 inch per inch (0.005 to 0.008 cm per cm) would require about 0.015 inches to about 0.020 inches (0.038 to 0.051 cm) of a thermally conductive tape (3M Brand 8815 or 3M 8820 Thermally Conductive Thermal Interface Tape, available from 3M Co., St. Paul, Minn.) to achieve a surface wet-out of greater than about 70% onto a flat glass panel (flatness of about 0.001 inch per inch (0.0025 cm per cm)). The flexible heat sink design with the same base dimensions needs only about 0.002 to 0.005 inch (0.05 to 0.13 mm) thick tape to achieve a wet-out of at least about 75% onto this glass panel. Thus, the present invention provides a flexible heat sink and thinner thermal interface, which reduces cost and thermal impedance as compared to a combination of an extruded aluminum heat sink and thicker thermal interface tape.

The flexible heat sink article can also include an enhancement layer selected to improve one or more properties such as conductivity, mechanical strength, and/or adhesion. This layer may include a primer or adhesion promoter, scrim (thermally conductive polymers, fillers, nickel or nickel-coated scrims, carbon scrims, nickel-coated carbon scrims, combinations thereof, and/or blended materials), oriented wires, random wire mesh (such as steel wool and the like), non-woven mesh (ceramic, metal, etc.) or foil (aluminum, copper, etc.). Scrim can be internal, external, or partially embedded in the base of some higher thermal conductivity material(s) to the base that does not significantly adversely impact the flexibility of the flexible heat sink design (e.g., wires in a flexible polymer case) so that the heat spreading performance of the heat sink can be improved. The flexibility of the heat sink with the added internal heat spreading features can increase the flexural rigidity of a comparable design heat sink without the internal heat spreading feature by less than about 20×, preferably less than about 10×, more preferably less than about 5×, and in some embodiments less than about 2×. This heat spreading is desirable in applications with local hot spots under the heat sink base.

Figure 1C:
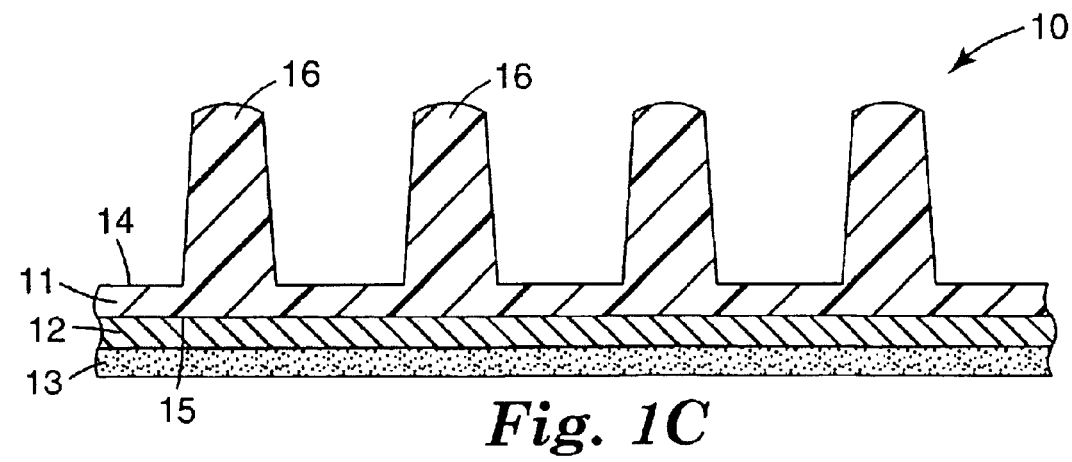
FIG. 1C is a side-sectional view of a heat sink article according to another embodiment of the present invention.

Referring now to FIG. 1C, shown is a side-sectional view of heat sink article 10 according to one embodiment of the present invention. Heat sink article 10 includes base 11 having first surface 14 with a plurality of polymeric protrusions 16 and second surface 15. Metallic layer 12 is contiguous with second surface 15 of base 11. Optionally, thermal interface material 13 is contiguous with metallic layer 12.

The adhesive (or thermal interface material) may contain thermally conductive particles that can bridge the adhesive and/or thermal interface matrix and be exposed through the matrix to a degree increasing with their size. Thus, particles are contained within the adhesive and/or thermal interface material and improve thermal conductivity in the path between the heat-source substrate and heat sink article 20. These particles are of sufficient size to impinge near or against base 21 of heat sink article 20 such that they impress into or onto second surface 25. These particles optionally impinge the surface of the adhesive opposite the base. Additionally, these particles impress into or onto the heat-source substrate when the heat sink article is placed in service. Generally, increasing the size of these particles to the same adhesive thickness will increase the thermal conductivity between a substrate and the heat sink.

The choice of particle size depends on the application. For example, particles having a major dimension of at least about 1–2 μm and about 30 μm or below, preferably between about 5 and 20 μm, are suitable for articles such as grease, phase change material, liquids, and tapes such as where the bond line will be in the 25 to 100 μm range (such as found between a central processing unit (CPU) and a heat sink). Particles larger than about 20 to 30 μm, such as 50 to 250 μm are used in thicker products such as silicone pads where a larger gap exists between the hot and cold substrates. In addition, combinations of different particle size materials can be used. Generally, larger particles are used to increase bulk conductivity, limited by the largest dimension of such particles keeping apart substrates that otherwise have thin gaps. The minor dimension of the particles is about the same (for generally spherical particles) or less than the major dimension (for acicular particles, fibers, plates, etc.).

When at least some of the selected particles are capable of being plastically deformed during heat sink article attachment, these particle sizes can be even larger than the sizes mentioned above.

In one embodiment, the heat sink article can be heated and reformed into a new shape with a platen or die that is shaped to conform the heat sink article to the heat-source chip package or device. Thus, the heat sink article in this aspect is thermoplastically reformable and can be customized for various chips and/or chip packages of any desired shape. For example, chips having bowed, uneven, or less than perfectly planar surfaces are easily accommodated via reforming the base and/or adhesive and/or thermal interface material of the inventive heat sink article. This type of reforming may be especially useful for those packages (heat-generating devices) with large degrees of non-flatness or curvature.

The conformable and reformable features of the inventive heat sink provide significant assembly options for the end user design and implementation. For example, the end user can begin with a roll of the inventive heat sink material, which will inherently conform to package "A", whereas the end user can cut a different base dimension for package "B" from the same roll of heat sink material. Further, the end use can include grooves or slits in or on the base to increase the degree of conformability. In particular, one can bridge two or more devices in the same vicinity on a printed circuit board, which devices have differing heights, conform the heat sink to a unique package, such as a Heat Slug Ball Grid Array (HSBGA) package that has a metal slug to aid in heat dissipation from the packaged chip, and is sunk into or out of the typical ball grid array (BGA) plastic package format. The heat sink of the present invention independently can be hot pressed in selected areas to conform to the device such as for a package "C" on the same PCB mentioned above. Another region of the heat sink material can overhang the package edges to provide additional heat flow and sinking paths from the chip.

A web-based heat sink according to the present invention also provides a heat sink design at a combination of low cost and good performance for the intended application. With more devices producing more heat, the low cost heat sink provides the means to dissipate heat across a wide spectrum of power densities, device lifetimes, and environmental conditions. For example, a lower expected life of a device may warrant a lower cost heat sink with modest heat dissipation when the life of the device need not be significantly increased by using an expensive heat sink. In another example, the desire to mitigate high temperature spikes in the environmental conditions of use may warrant a conformable and flexible heat sink, even where no heat sink had been used before the present invention.

In another embodiment, the heat sink may comprise a two-layer adhesive construction. The polymeric protrusions and optionally an inner layer of the base comprise an adhesive that is cured to a composition that is non-tacky at the normal temperatures of heat sink article use. The base comprises an outer layer which comprises an adhesive layer that remains tacky at the normal temperatures of heat sink article use, such as a pressure-sensitive adhesive (PSA). A pressure sensitive adhesive means an adhesive that is normally tacky at the use temperature and bonds to a surface upon application of pressure.

One example of a suitable material for this embodiment is a structural or structural hybrid adhesive. As used herein, a structural adhesive means an adhesive that is unflowable, and/or thermoset after substantially complete curing. The structural hybrid adhesive has a first stage, e.g., PSA stage, before curing or after partial curing, and is further curable to a second stage, e.g., structural stage after the substantially complete curing. In this use, the heat sink article also may be a dual layer or multi-layer system where, preferably, at least one outer layer on the base remains a PSA while the polymeric protrusions and inner layer of the base comprise a cured structural adhesive.

The polymeric protrusions may comprise a cured or structural adhesive region while the base comprises a layer of PSA or structural adhesive. In one aspect, both regions comprise substantially similar precursor compositions, which compositions are subjected to differing curing levels. The polymeric protrusions preferably are cured to have a non-tacky surface while the side of the base opposite the polymeric protrusions is cured to a lesser extent.

The adhesive can be provided in the cavities of a mold or tool to shape the polymeric protrusions out of the adhesive. The adhesive may be a solvent-based or water-based adhesive so that on drying and removal of the solvent or water, the adhesive retains the shape of the mold. The adhesive also may be substantially solvent-free (100% solids), which is polymerized or cured in the shape of the mold or tool. The dried, cured, or polymerized adhesive can be provided with a base via coating or lamination with the same, similar, or different adhesive, before or after curing the polymeric protrusion regions. The level of curing is controlled to be greater in the polymeric protrusions regions when a PSA region on the base is desired. In another aspect, the heat sink base and polymeric protrusions are cured to form a structural adhesive. The base then can be provided with another layer, such as a thermal interface material layer as described above. A dual-layer or multilayer heat sink also can be made via coextrusion using a hot melt structural adhesive and a PSA.

Useful materials in these embodiments include combinations of an epoxy adhesive with another adhesive such as acrylate, silicone, polyester, and/or polyolefin adhesive(s), silicone and acrylate adhesives, along with appropriate known curing agents.

The heat sink article of the present invention can be made by any known method. In one aspect, a method providing alignment of thermally conductive particles is desired. Suitable processes include, for example, vacuum forming, thermoforming, compression molding, continuous molding (replication), profile extrusion (through-molding), injection molding, embossing, and cold forming. Presently preferred methods will now be described with the formation of a base having polymeric protrusions on at least one side thereof formed by extrusion replication or profile extrusion.

Figure 2:
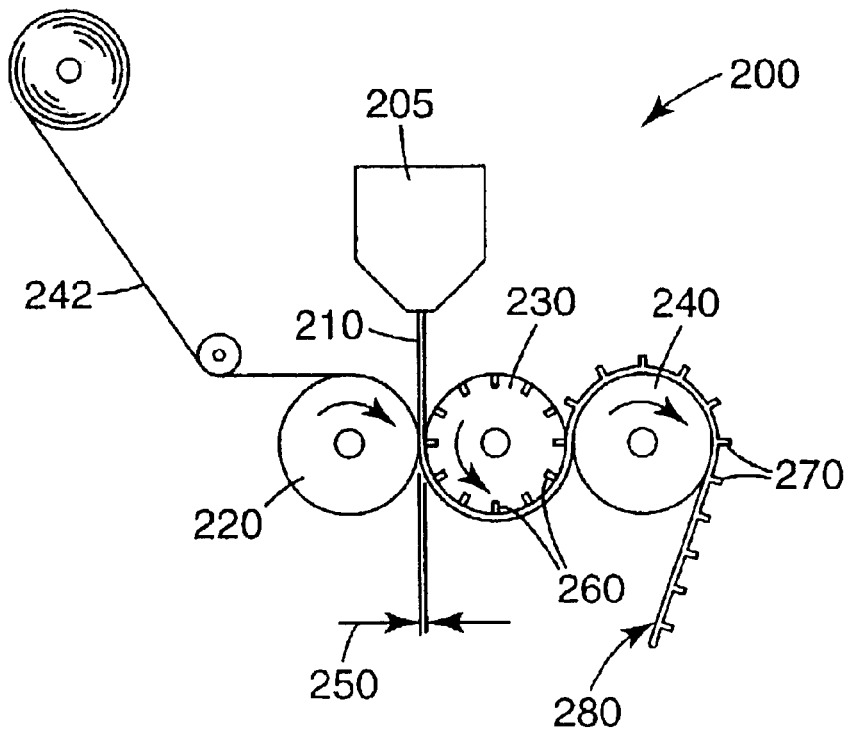
FIG. 2 is a schematic illustration of a three-roll molding apparatus for a method according to one embodiment of the present invention.

Referring to FIG. 2, the process schematically illustrated shows three-roll molding apparatus 200 that includes extruder with extrusion die 205 adapted for extruding one or more layers of molten polymeric material 210 into mold roll 230. In this embodiment, mold roll 230 has on its outer cylindrical surface a desired surface pattern for transference to molten polymeric material 210 as it passes over the cylindrical surface of mold roll 230. In the illustrated embodiment, the surface of mold roll 230 has a plurality of arranged cavities 260 adapted to form a plurality of polymeric protrusions 270. Cavities 260 may be arranged, sized, and shaped as desired to form a suitable surface stem structures from polymeric material 210. In one embodiment, a sufficient additional quantity of molten polymeric material 210 is extruded into mold roll 230 to form at least a portion of the backing layer Mold roll 230 is rotatable and along with opposed roll 220 forms nip 250. This nip 250 assists in flowing molten polymeric material 210 into cavities 260. The width of nip 250 can be adjusted to assist the formation of a selected thickness of a backing layer of polymeric material 210. Optionally, backing layer 242 simultaneously is brought into nip 250. Depending upon the composition of the elastomeric material and the geometry of the polymeric protrusions 270, backing layer 242 may be useful in efficiently removing heat sink article 280 from mold roll 230 and may form an integral part of heat sink article 280. In addition, heat sink article 280 may traverse third roll 240 after exiting mold roll 230. In this process, the temperatures of all three rolls 220, 230, and 240 each may be independently selectively controlled to achieve desired cooling of polymeric material 210.

Mold roll 230 may be of the type used for either continuous processing (such as a web, tape, a cylindrical drum or a belt), or batch processing (such as an injection mold or a compression mold). When making mold roll 230 for forming polymeric protrusions 270, cavities 260 of mold roll 230 may be formed in any suitable manner, such as one or more of chemical, electrical, and mechanical machining or forming processes. Examples include drilling, machining, laser drilling, e-beam drilling, water jet machining, casting, etching, die punching, diamond turning, engraving knurling, and the like. The mold roll also may be composed of notched wire with a spacer wire or notched plates separated by spacer plates. The placement of the cavities determines the spacing and orientation of the heat sink article. Polymeric protrusions 270 typically have shapes corresponding to the shape of cavities 260. The mold cavities can be open at the end of the cavity opposite the surface from which the molten polymeric material is applied to facilitate injection of the polymeric material into the cavity. If the cavity is closed, a vacuum can be applied to the cavity so that the molten polymeric material fills substantially the entire cavity. Alternatively, closed cavities can be longer than the lengths of the stem structures being formed so that the injected material can compress the air in the cavities. The mold cavities may be designed to facilitate release of the surface stem structures, and thus may include angled sidewalls, or a release coating on the cavity walls. The mold surface may also include a release coating thereon selected to facilitate release of the polymeric material base layer from the mold. In some embodiments, the cavities can be angled relative to the surface of the roll, i.e., other than perpendicular to a tangent at the surface.

The mold can be made from suitable materials that range from rigid to flexible. The mold components can be made of metal, ceramic, polymeric materials, or combinations thereof such as a metal roll with a polymeric wrap wherein the cavities are in the wrap material. The materials forming the mold must have sufficient integrity and durability to withstand the thermal energy associated with the particular flowable polymeric material used to form the base layer and surface topographies. In addition, the material forming the mold preferably allows the cavities to be formed by various methods, is inexpensive, has a long service life, consistently produces material of acceptable quality, and allows for variations in processing parameters.

The molten polymeric material can be flowed into the mold roll cavities, and over the surface of the mold roll to form a layer of cover material, or a separate stream of polymeric material of the same or different composition can be used to form a layer of cover material. To facilitate flow of the molten polymeric material, the polymeric material typically must be heated to an appropriate temperature, and then coated into the cavities. This coating technique can be any conventional technique, such as calendar coating, cast coating, curtain coating, die coating, extrusion, gravure coating, knife coating, spray coating or the like. FIG. 2 shows a single extruder and extrusion die arrangement. However, the use of two (or more) extruders and associated dies allows simultaneous extrusion into the nip 250 of a plurality of polymeric materials to achieve a multi-component (e.g., layered, striped, or blended) laminate cover material.

The flow of molten polymeric material 210 into mold roll 230 also may be assisted by the application of pressure between opposing roll 220 and mold roll 230. When backing layer 242 includes a porous material, the three-roll molding apparatus 200 can be used to control the degree of penetration of molten polymeric material 210. With this apparatus, the quantity of molten polymeric material 210 can be controlled to barely penetrate the surface coating of backing layer 242, or penetrate the porous backing layer 242 on the opposite side of introduction of polymeric material 210 so as to partially, substantially, or fully encapsulate backing layer 242. The penetration of molten polymeric material 210 into porous backing layer 242 may also be controlled by the temperature of the molten polymeric material 210, the quantity of polymeric material 210 in nip 250, and/or by extruder flow rates in conjunction with the line speed of the mold cavities. The flow of molten polymeric material 210 into mold roll 230 also may be assisted by evacuating the cavities before applying the polymeric material.

After the molten polymeric material 210 has been coated in cavities 260 and over the surface of mold roll 230, the polymeric material is cooled to solidify and form the desired exterior surface topography thereon (e.g., polymeric protrusions 260). The solidified polymeric material is then separated from mold roll 230. Polymeric material 210 often will shrink slightly when it is cooled and solidified, which facilitates release of the material (e.g., surface protrusion structures and base or additional backing layer) and integral film layer from the mold as shown in FIG. 1. Part or the entire mold may be cooled to aid in solidifying the surface stem structures and base or additional backing layer. Cooling can be effected directly or indirectly via any known means such as using water, air, other heat transfer fluids, or other cooling processes.

Some molding processes may use curable or thermoset polymers such as the structural hybrid embodiment described above. When such resins are used, the resin typically is applied to the mold as a liquid in an uncured or unpolymerized and/or molten state. After the resin has been coated onto the mold, it is polymerized or cured and cooled (if necessary) until the resin is solid. Generally, the polymerization process involves either a setting time, or exposure to an energy source, or both to facilitate the polymerization. The energy source can be heat or other radiation energy such as an electron beam, ultraviolet light, or visible light. After the resin is solidified, it is removed from the mold. In some embodiments, it may be desired to further polymerize or cure the thermosetting resin after the polymeric protrusions are removed from the mold cavities. Examples of suitable thermosetting resins include melamine resins, formaldehyde resins, acrylate resins, epoxy resins, urethane resins, silicone resins, fluoropolymer resins, and the like.

Figure 3:
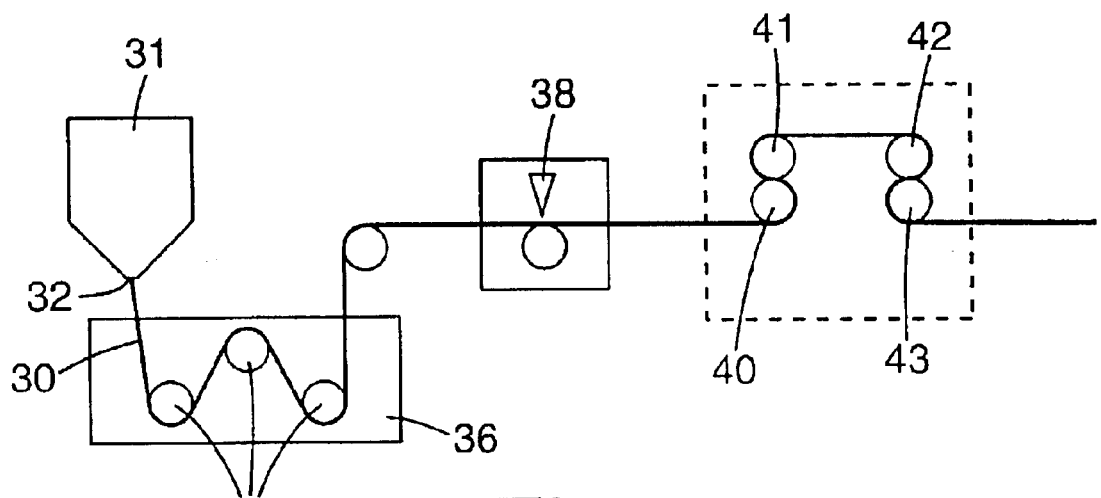
FIG. 3 is a schematic illustration of a profile extrusion apparatus for a method according to another embodiment of the present invention.
Figure 4:
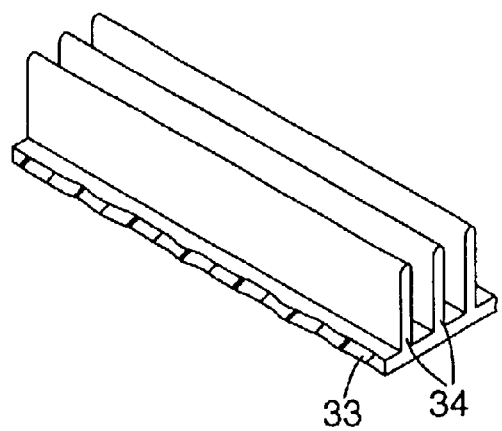
FIG. 4 illustrates a heat sink structure of one embodiment of the invention.
Figure 5:
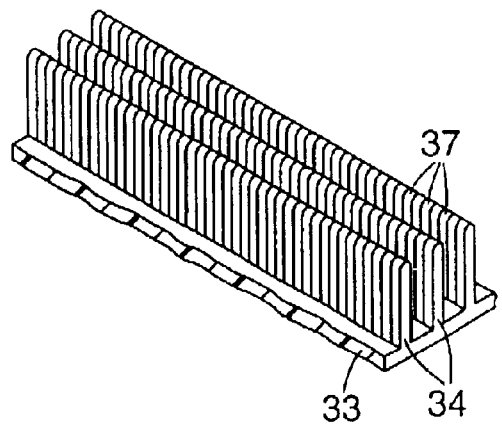
FIG. 5 illustrates a heat sink at an intermediate processing stage of one embodiment of the invention.
Figure 6:
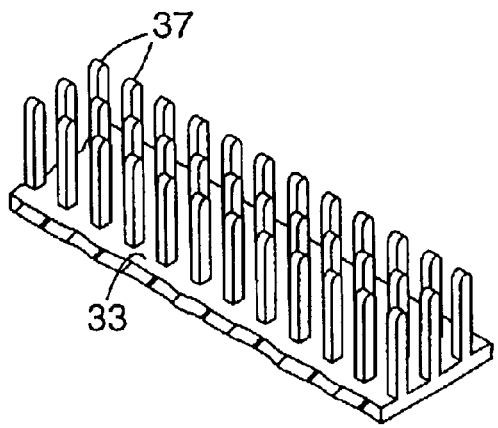
FIG. 6 illustrates a heat sink structure of another embodiment of the invention.

Another method of making flexible heat sink of the invention is shown in schematically in FIG. 3 while the output is shown in FIGS. 4, 5, and 6. Generally, this method includes first extruding polymer 30 from extruder 31 through die 32, which die has a shaped profile corresponding to the desired polymeric protrusion cross-sectional shape. One useful shape is shown in FIG. 4, where base 33 and elongate spaced ribs 34 project above an upper surface of base 33 and have the desired cross sectional shape. In FIG. 3, polymer 30 moves around rollers 35 through quench tank 36 filled with a cooling liquid (e.g., water), after which ribs 34 are transversely cut (although not through the full thickness of base 33) at spaced locations along their lengths by cutter 38 to form discrete polymeric protrusions 37 (see FIG. 5) of ribs 34 having lengths corresponding to the desired shapes of polymeric protrusions. Cutter 38 can involve any known means such as reciprocating or rotating blades, lasers, or water jets.

In one aspect, after cutting ribs 34, base 33 of polymer 30 is longitudinally extended at a draw ratio of at least about 1.25 to 1, and preferably at a stretch ratio of about 2 or even 4 to 1 between a first pair of nip rollers 40 and 41 and a second pair of nip rollers 42 and 43 driven at different surface speeds. In this aspect, roller 41 is heated to warm base 33 before drawing, and roller 42 is chilled to stabilize elongated base 33. This extension forms spaces between discrete polymeric protrusions 37 of ribs 34 which then become polymeric protrusions in the completed heat sink. Alternatively, cutter 38 can be selected to remove material, leaving the desired amount of space between adjacent polymeric protrusions.

FIG. 4 shows a profile-extruded rail in one aspect of the invention. Base 33 supports rails 34. In FIG. 5, a heat sink rail article such as shown in FIG. 4 has been transversely cut to form discrete polymeric protrusions 37. In FIG. 6, the heat sink rail article shown in FIG. 5 has been drawn to separate discrete polymeric protrusions 37, or the heat sink rail article of FIG. 4 has been transversely cut and material has been removed to form discrete polymeric protrusions 37.

In one aspect of the flexible heat sink, ribs 34 preferably are spaced apart between their adjacent edges by at least about 0.50 millimeter (mm), and more preferably by between about 0.6 to 1.0 mm. The base extension process is used to separate the polymeric protrusions to a level that provides sufficient cooling fluid flow around the polymeric protrusions in the heat sink. In one aspect, the protrusions are separated by at least about 0.10 mm, and preferably by between about 0.6 and 1.0 mm.

Objects and advantages of this invention are further illustrated by the following examples, but the particular materials and amounts thereof recited in these examples, as well as other conditions and details, should not be construed to unduly limit this invention.

EXAMPLES

Test Methods

1) Cooling Performance

A variable power supply (E3611A DC Power Supply available from Hewlett Packard, Palo Alto, Calif.) was used to drive a 10 Ohm resistor that generates a continuous flow of heat. This heat was dissipated to the heat sink, which in turn was cooled by a fan (3M 961 Ionized Air Blower available from 3M Electrical Specialties Division, Austin, Tex.) on high setting that blew ambient air directly over it. A K-type thermocouple (available from Omega Engineering Inc., Stamford, Conn.) was installed very near to the surface of the resistor to measure the temperature of the device. The entire device was held loosely in a phenol housing which helped insulate the resistor on four sides and allowed for reproducible positioning. During testing, voltage and current of the power supply were preset to 4.0 Volts and 0.4 Amperes respectively. The fan was set on "High" (air flow speed around 600 to 700 feet per minute (183 to 213 m per minute)) and was positioned 10 cm (4 inches) from the right edge of the phenol housing and angled slightly downward. The footprint of each heat sink sample was 1 square centimeter, unless otherwise specified in the Examples, and each sample was mounted onto the resistor using a piece of 3M 8805 Thermally conductive Adhesive Transfer Tape (available from 3M Company, St. Paul, Minn.) that was the same size as the sample.

Tests were performed by first measuring the baseline temperature T1 of the device with no sample mounted and no fan cooling. A second baseline reading T2 was made with the fan on high setting, and then readings T3 were taken with the fan on "High" and the sample mounted. Typically, a 20 minute time interval was used between measurements to allow for temperatures to stabilize.

The temperatures were recorded and the difference in temperature (Delta T) with and without the sample was calculated as Delta $T=(T2-T3)$ 2) Wet-Out Capability Samples were mounted onto the concave surface of a concave watch glass using a thermally conductive tape (2 mil 9882, available from 3M Company, St. Paul, Minn.). Alternatively, samples were mounted onto flat glass using a thermally conductive tape (5 mil 8805, available from 3M Company, St. Paul, Minn.). The mounted samples were then imaged from below (through the glass) using a flatbed scanner. Wet-out was determined by measuring the area of the dark regions in the gray-scale image using commercial software (Image Pro Plus, available from Media Cybernetics, Silver Springs, Md.). The wet-out capability (%) was calculated as follows:

$$\% \text{ Wet-out} = \frac{\text{total area of dark regions}}{\text{total area of sample}} \times 100$$

The software provided a frequency distribution of the intensities (gray intensity) in the image and output an image intensity histogram. In addition, the software was used for a ¼-tone enhancement to modify the intensity scale and improve contrast in one image without significantly changing the wet out percent.

3) Particle Orientation

X-Ray transmission geometry data were collected with a Bruker General Area Detector Diffraction System (GADDS) microdiffractometer, copper K radiation, and HiStar 2D detector registry of the scattered radiation (available from Bruker AXS Inc., Madison, Wis.). The diffractometer was fitted with 300 µm incident beam collimator and graphite incident beam monochromator. The detector was centered at a scattering angle of 0 degrees (2) using a sample to detector distance of 6 cm. No sample tilt was used. X-ray generator settings of 50 kV and 50 mA were used. For each 2D image the intensity produced by the graphite (0 0 2) diffraction planes was found to be anisotropic and observed as discrete sharp reflections indicating the presence of significant orientation (i.e., the graphite particles are substantially aligned). The diffracted intensity produced by a non-oriented (random) distribution of particles would be isotropic and observed as a continuous ring of uniform intensity. The samples tested were composed of more substantially aligned particles along with some particles that were not aligned as well (or even random). Heat sinks with higher levels of aligned particles are preferred. Azimuthal traces of the graphite (0 0 2) maximum provided a measurement of the degree of graphite particle alignment. Azimuthal traces were subjected to profile fitting using ORIGIN (available from OriginLab Corp., Northampton, Mass.). Peak fitting employed a Gaussian peak shape model and linear background model. Extent of graphite alignment was taken as the full width at half maximum (FWHM) of the azimuthal trace maxima. The reported values are in degrees followed by the standard deviation based on two measurements (180 degrees apart in the 2D image). The full range theoretically is from 0 to 180 degrees, with lower values indicating greater alignment.

Particle orientation also can be measured by sectioning samples and counting particles, optionally aided by known image processing techniques.

Materials

| Component | Trade Name | Description | Source |
|---|---|---|---|
| Polymer A | URC 7000-TC-1 | melt processable, carbon-filled urethane resin | PolyOne Corp., Cleveland, OH |
| Polymer B | PolyONE ™ UR-55 CF | melt processable, carbon-filled urethane elastomer | PolyOne Corp. |
| Polymer C | CoolPoly ™ RS083 | melt processable, elastomeric resin filled with non-spherical carbon particles | Cool Polymers, Warwick, RI |
| Polymer D | CoolPoly ™ RS090 | melt processable, elastomeric resin filled with non-spherical carbon particles | Cool Polymers |
| Polymer E | CoolPoly ™ RS077 | melt processable, elastomeric resin filled with non-spherical carbon particles | Cool Polymers |
| Silicone Resin | Silastic ™ J | silicone resin | Dow Corning Corp., Midland, MI |
| Purge Compound | Unipurge ™ | cleaning material | Dow Chemical Corp., Midland, MI |
| Fabric Scrim | Fabric Scrim 250, Style #924856 | 65/35 cotton/polyester blended warp and fill | Milliken & Co., Spartanburg, SC |

Example 1

A flexible heat sink article was prepared using a process and apparatus such as illustrated in FIG. 2.

Pellets of Polymer A were fed into a single screw extruder (Model KTS-125 available from Killion Extruders, Inc. of Cedar Grove, N.J.) and melt-processed. The extruder had a diameter of about 3.2 cm (1.25 in), a screw speed of 80 rpm and a rising temperature profile from about 100° C. up to approximately 250° C. The Polymer A resin was conveyed through the extruder into a heated neck tube at 250° C. and finally into a 250° C. heated 15.2 cm (6 inches) wide sheet die with a maximum die lip opening of 0.102 cm (0.040 inch). The resin was continuously discharged from the sheet die at a pressure of 17.2 MPa (2500 psi) to form a molten polymer sheet.

Referring now to FIG. 2, molten polymer sheet 210 formed as described above was introduced into nip 212 between nip roll 220 and cast roll 230 of a horizontal stack of three temperature-controlled, rotating, 30.5 cm (12 inches) diameter, cylindrical rolls, that were rotating at 0.61 meters (2 feet) per minute. All three rolls of the stack were polished, chrome-plated steel.

Nip roll 220 was pushed against cast roll 230 with a pressure of 0.24 MPa (35 psi). Cast roll 230 provided a surface containing cavities with diameters of about 2 mm, depths of about 16 mm and in a hexagonal array (the distance between center of cavities in same lateral row was about 3 mm; the distance between two adjacent lateral rows, measured from hole center in one row to hole center in the adjacent lateral row was about 2.6 mm; and the offset distance between cavities in adjacent lateral rows was 1.5 mm). The cast roll and the nip rolls were heated to 32° C.

While molten polymer sheet 210 was fed into the nip, Fabric Scrim simultaneously was fed into nip 212 between nip roll 220 and cast roll 230 of the horizontal stack, and hence also rotated into the nip. As fabric scrim 250 was rotated into the nip, some of the molten polymer penetrated through and durably melt bonded to the fabric to form a laminate. As the molten polymer was solidified by the surface of nip roll 240, nip roll 220 released the laminate to follow cast roll 230 to nip roll 240. The article thus formed had a pattern thereon derived from the tool, and subsequently was stripped from nip roll 240 and the fabric scrim backing was removed to give a heat sink article having polymeric protrusions on one surface. The total thickness of the heat sink article base was 0.6 cm, with the polymeric protrusions (posts) having a major dimension (height) of around 0.5 cm.

The heat sink article prepared above was tested for cooling performance. The footprint of the sample was 1.3 cm×1.3 cm. The temperature of the resistor was 63° C. with no cooling (T1) and was 47° C. with fan cooling (T2). The cooling performance results were T3=39.6° C. and Delta T=7.4° C. Significant particle orientation was observed via X-ray diffraction (36.5 degrees (3.3 standard deviation)).

Example 2

Figure 7:
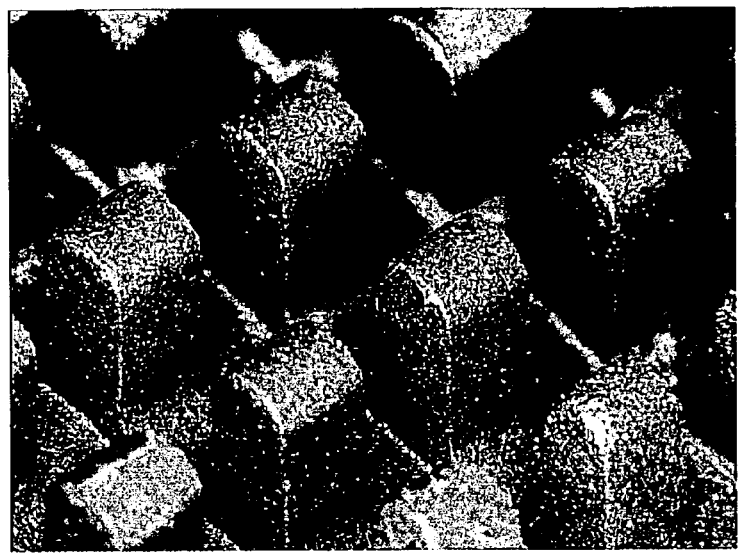
FIG. 7 is a perspective view of one embodiment of the present invention.

Two flexible heat sink articles (2A and 2B) as shown in FIG. 7 were prepared by melt replication from Polymer C and Polymer D using a silicone mold.

The silicone mold used to produce heat sink article as shown in FIG. 7 was prepared by casting Silicone Resin onto a commercially available aluminum heat sink. The resin was allowed to cure overnight at room temperature and the cured resin was removed from the heat sink to provide a silicone mold.

One or two 1.18 cm (3 inches) long by 1.18 cm (3 inches) wide by 0.32 cm (⅛ inch) thick plaques of either Polymer C (to make heat sink article 2A) or Polymer D (to make heat sink article 2B) were aligned on the mold, then sandwiched between silicone coated paper liners, and melt pressed at 190° C. (374° F.) and a pressure of 454.5 kg (0.5 tons) for about 10 seconds followed by quenching on a cold press for 30 seconds. A thin layer of mold release agent was sometimes applied to the surface of silicone mold prior to melt pressing to facilitate release of the heat sink article from the mold.

Heat sink articles of Examples 2A and 2B, as shown in FIG. 7, each had a square matrix design of square, straight-sided polymeric protrusions having dimensions of about 1.8 mm (0.071 inch) wide, about 1.8 mm (0.071 inch) long, and about 3.5 mm (0.138 inch) high, with a center-to-center spacing of about 4 mm (0.16 inch), and a base thickness of about 1 mm (0.039 inch).

Heat sink articles 2A and 2B were tested for cooling performance and heat sink article 2A was tested surface wet-out capability using 9882 adhesive onto a concave watch glass. The wet-out capability was lower than later samples because the base surface of this early prototype was rough and the thinnest thermal transfer tape available was used. Results are reported in Table 1 below. The temperature of the resistor was 71.5° C. with no cooling (T1) and was 49.3° C. with fan cooling (T2). Significant particle orientation was observed via X-ray diffraction (42.5 degrees (2.4 standard deviation)).

Example 3

Figure 8:
FIG. 8 is a perspective view of another embodiment of the present invention.

A heat sink article as shown in FIG. 8 was prepared as in Example 2, using a silicone mold and Polymer C. The silicone mold was prepared from a commercially available aluminum heat sink.

The resultant heat sink article had a square matrix design of polymeric protrusions that were tapered on one side. The width of the tapered side of the protrusion was about 1.6 mm (0.63 inch) at the top and about 2.2 mm (0.87 inch) at the point where the projection joined the base. The width of the straight side of the protrusion was about 2.5 mm (0.098 inch). The height of each projection was about 9 mm (0.35 inch) and the center-to-center spacing of the projections was about 5 mm (0.2 inch). The thickness of the heat sink article base was about 1.7 mm (0.067 inch).

The heat sink article was tested for cooling performance and wet-out capability on a concave surface with 9882 adhesive. The wet-out capability was lower than later samples because the base surface of this early prototype was rough and the thinnest thermal transfer tape available was used. Results are reported in Table 1 below. The temperature of the resistor was 71.5° C. with no cooling (T1) and was 49.3° C. with fan cooling (T2). Significant particle orientation was observed via X-ray diffraction (38.9 degrees (0.8 standard deviation)).

Examples 4A, 4B, and 4C

Figure 9:
FIG. 9 is a perspective view of yet another embodiment of the invention.

Three flexible heat sink articles (4A, 4B, and 4C) as shown in FIG. 9 were prepared by melt replication as described in Example 2 except that a structured aluminum plate was used in place of a silicone mold. Polymer E (used to make heat sink article 4C), was used in addition to Polymer C (used to make heat sink article 4A), and Polymer D (used to make heat sink article 4B).

The resultant heat sink articles had a wave pattern of tapered sided, rail-shaped polymeric protrusions (hereinafter referred to as rails) on an about 1 mm (0.039 inch) thick base. The rails tapered from about 1 mm (0.039 inch) at the base to about 0.2 mm (0.008 inch) at the peak. The height of each rail was about 2 mm (0.079 inch).

The heat sink articles were tested for cooling performance. Results are reported in Table 1 below. The temperature of the resistor was 71.5° C. with no cooling (T1) and was 49.3° C. with fan cooling (T2). Particle orientation was not measured.

Example 5

Figure 11:
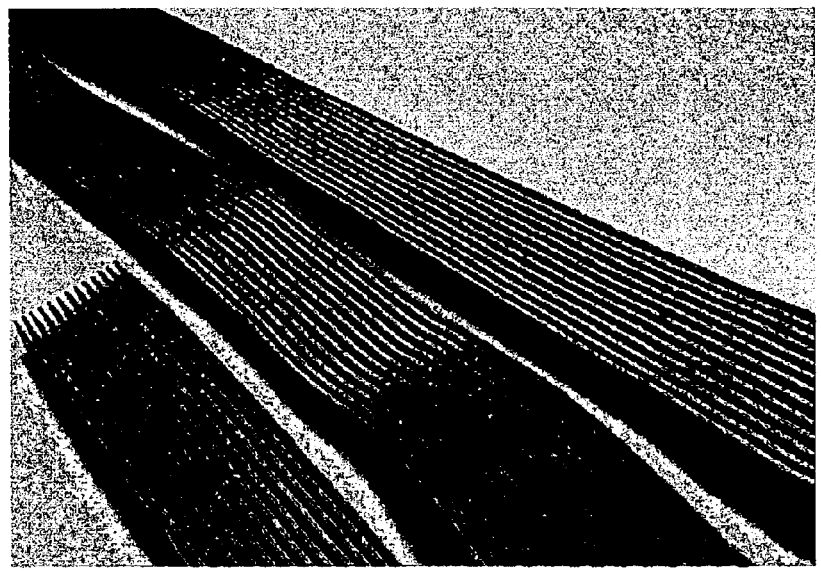
FIG. 11 is another embodiment of the present invention prepared using the die of FIG. 10.

A flexible heat sink article as shown in FIG. 11 was prepared by profile extrusion.

Figure 10:
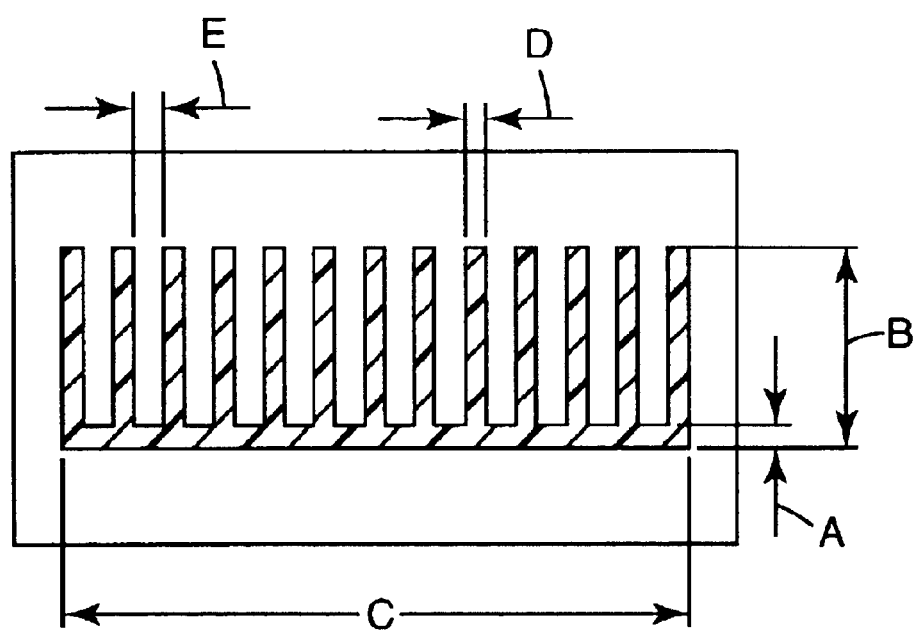
FIG. 10 is a view of a profile extrusion die used to make an embodiment of the present invention.

Pellets of Polymer C were fed into a 3-zone, 25.4 mm (1 inch), single-screw extruder (available from Haake Corp., Karlsruhe, Germany), operating at 40 rpm. The extruder was cleaned with Purge Compound. The zones of the single screw extruder had set point temperatures as follows: Zone 1: 170° C. (338° F.), Zone 2: 200° C. (392° F.), and Barrel 3: 210° C. (410° F.). Polymer C was processed through the extruder to a profile die having a shape as shown in FIG. 10, where base thickness A was 0.76 mm, protrusion height B was about 6.35 mm, the overall rail width C was 22.1 mm, the width of the protrusion D was 0.76 mm, and the space between adjacent protrusion rails E was about 1.0 mm. The polymer was continuously discharged from the die at a pressure of at least 100 psi (0.69 MPa) and guided so that a straight, continuous heat sink article was formed. The rail extruded through the profile die was flooded with water to quench the polymer immediately upon its exit from the die.

The resultant heat sink article had a pattern of straight sided rails on an about 1 mm to 2 mm thick base. The rail protrusions were about 5.5 mm (0.217 inch) high.

The distance between adjacent fins was about 0.5 mm (0.02 inch).

The heat sink article was tested for cooling performance. Results are reported in Table 1 below. The temperature of the resistor was 71.5° C. with no cooling (T1) and was 49.3° C. with fan cooling (T2). Significant particle orientation was observed via X-ray diffraction (47.5 degrees (2.0 standard deviation)).

Comparative Examples A and B

Two aluminum heat sinks (A and B) were tested for cooling performance. CE-A had an overall height of 4 mm with 16 pins, while CE-B had an overall height of 10 mm and 9 pins.

TABLE 1

Material and Performance

| Example | Polymer | T3, ° C. | Delta T, ° C. | Wet-Out, % |
|---|---|---|---|---|
| 2A | C | 40.7 | 8.6 | 63.4 |
| 2B | D | 40.4 | 8.9 | NT |
| 3 | C | 37 | 12.3 | 55.5 |
| 4A | C | 43.7 | 5.6 | NT |
| 4B | D | 40.7 | 8.6 | NT |
| 4C | E | 41.1 | 8.2 | NT |
| 5 | C | 35.9 | 13.4 | NT |
| CE-A | Aluminum | 37.2 | 12.1 | NT |
| CE-B | Aluminum | 34.1 | 15.2 | NT |

Each heat sink had a footprint of about 1.3 cm × 1.3 cm, and "NT" means not tested.

Example 6

Two flexible heat sink articles (6A and 6B) as shown in FIG. 11 were prepared by profile extrusion using the procedure of Example 5. Polymer B was used to make beat sink article 6A and Polymer C was used to make heat sink article 6B (which was made as in Example 5). The thickness of each article base was about 2 mm.

The heat sink articles were tested for cooling performance. Results are reported in Table 2 below. The temperature of the resistor was 53.4° C. with fan cooling (T2).

TABLE 2

Material and Cooling Performance

| Example | Polymer | T3, ° C. | Delta T, ° C. |
|---|---|---|---|
| 6A | B | 44.3 | −9.1 |
| 6B | C | 42.6 | −10.8 |

Example 7

Seven heat sink articles having polymeric protrusions in a square pattern were prepared using a hot press.

A mold was prepared by drilling holes through a 9-mm-thick silicone tool in a square pattern. Each polymeric protrusion was the shape of a post having the desired post size and spacing as specified in Table 3 below.

Resin pellets were placed on the mold. Silicone release paper was placed on the pellets on the side of the mold not covered with pellets. The "sandwich" construction was then placed on a heated (193.5° C. (380° F.)) platen. A second 193.5° C. platen was brought into contact with the construction. After about 30 seconds, the platens were forced together under a pressure of 8.27 MPa (1200 psi) for about 30 seconds.

The resultant heat sink articles were removed from the silicone mold and tested for cooling performance. The resin used, the diameter of the posts, the distance between the centers of adjacent posts, and cooling performance are reported in Table 3 below. The thickness of the heat sink article base was between 1 mm and 2 mm. Post Diameter (mm) is marked PD, and DBC is the distance (mm) between centers of adjacent posts.

TABLE 3

Material, Spacing, and Cooling Performance

| Example | Polymer | PD | DBC | T2, ° C. | T3, ° C. | Delta T, ° C. |
|---|---|---|---|---|---|---|
| 7A | B | 2 | 4 | 48.2 | 38 | 10.2 |
| 7B | B | 2 | 6 | 48.2 | 41.6 | 6.6 |
| 7C | B | 3 | 6 | 48.2 | 38.5 | 9.7 |
| 7D | C | 2 | 3 | 45.5 | 38.9 | 6.6 |
| 7E | C | 2 | 4 | 48.2 | 42.6 | 5.6 |
| 7F | C | 2 | 6 | 48.6 | 42.4 | 6.2 |
| 7G | C | 3 | 6 | 48.6 | 40.6 | 8.0 |

Example 8

Figure 12:
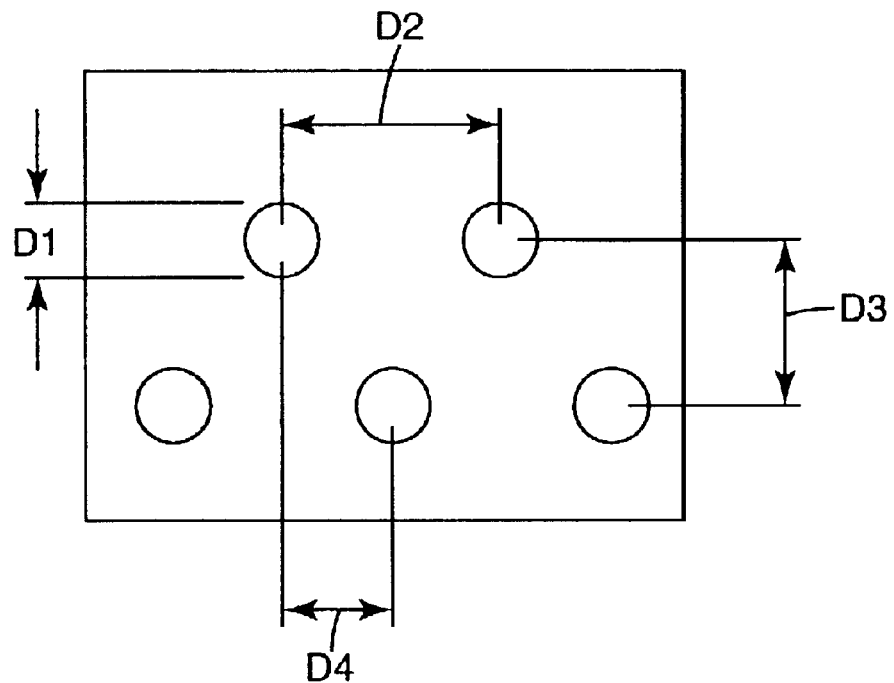
FIG. 12 is a schematic of a pattern of protrusions.

Twelve heat sink articles having polymeric protrusions in a hexagonal pattern as shown in FIG. 12 were prepared using a hot press.

A mold was prepared as described in Example 7 except in a hexagonal pattern where each protrusion was the shape of a post having the desired post size and spacing as specified in Table 4 below. The heat sink articles were formed according to the procedure of Example 7.

The resultant heat sink articles were removed from the mold and tested for cooling performance. The resin used, the diameter of the posts, the distance between the centers of the posts, and the cooling performance are reported in Table 4 below. The thickness of the heat sink article base was between 1 mm and 2 mm. The temperature of the resistor was 47° C. with fan cooling (T2). In Table 4, PD is the post diameter, D2 is the distance between adjacent posts in same lateral row, D3 is the distance between two adjacent lateral rows of posts, and D4 is the offset distance between posts in two adjacent lateral rows. All distances are in millimeters.

TABLE 4

Material, Size, and Performance

| Example | Polymer | D1 | D2 | D3 | D4 | T3, ° C. | Delta T, ° C. |
|---|---|---|---|---|---|---|---|
| 8A | B | 2 | 3 | 2.6 | 1.5 | 37.7 | 9.3 |
| 8B | B | 2 | 4 | 3.5 | 2.0 | 36.2 | 10.8 |
| 8C | B | 2 | 5 | 4.3 | 2.5 | 41.2 | 5.8 |
| 8D | B | 2 | 6 | 5.2 | 3.0 | 41.8 | 5.2 |
| 8E | B | 3 | 6 | 5.2 | 3.0 | 39.1 | 7.9 |
| 8F | B | 3 | 7 | 6.1 | 3.5 | 39.5 | 7.5 |
| 8G | C | 2 | 3 | 2.6 | 1.5 | 40.8 | 6.2 |
| 8H | C | 2 | 4 | 3.5 | 2.0 | 40.7 | 6.3 |
| 8I | C | 2 | 5 | 4.3 | 2.5 | 40.5 | 6.5 |
| 8J | C | 2 | 6 | 5.2 | 3.0 | 41.1 | 5.9 |
| 8K | C | 3 | 6 | 5.2 | 3.0 | 40.0 | 7.0 |
| 8L | C | 3 | 7 | 6.1 | 3.5 | 39.3 | 7.7 |

Example 9

Nine heat sink articles having a hexagonal pattern were prepared using a hot press and blends of resins Polymer C and Polymer B in various weight ratios.

A mold was prepared as in Example 8, giving the desired post size and spacing as specified in Table 5 below. Heat sink articles were formed according to the procedure of Example 7. The resins were pre-blended in a twin-screw extruder and then formed into pellets.

The resultant heat sink articles were removed from the mold and tested for cooling performance. The Polymer C/Polymer B weight ratios used, the diameter of the posts, the distance between the centers of the posts, the thickness of the heat sink article base, and cooling performance are reported in Table 5 below. The temperature of the resistor was 47° C. with fan cooling (T2). In Table 5, Ratio is the weight ratio of Polymer C to Polymer B.

TABLE 5

Material, Size, and Performance

| Example | Ratio | D1 | D2 | D3 | D4 | T3, ° C. | Delta T, ° C. |
|---|---|---|---|---|---|---|---|
| 9A | 25/75 | 2 | 4 | 3.5 | 2.0 | 37.7 | 9.3 |
| 9B | 25/75 | 2 | 5 | 4.3 | 2.5 | 39.2 | 7.8 |
| 9C | 25/75 | 2 | 6 | 5.2 | 3.0 | 40.0 | 7.0 |
| 9D | 50/50 | 2 | 4 | 3.5 | 2.0 | 36.9 | 10.1 |
| 9E | 50/50 | 3 | 5 | 4.3 | 2.5 | 37.7 | 9.3 |
| 9F | 50/50 | 3 | 6 | 5.2 | 3.0 | 38.8 | 8.2 |
| 9G | 75/25 | 2 | 4 | 3.5 | 2.0 | 37.1 | 9.9 |
| 9H | 75/25 | 2 | 5 | 4.3 | 2.5 | 39.6 | 7.4 |
| 9I | 75/25 | 2 | 6 | 5.2 | 3.0 | 40.8 | 6.2 |

Examples 10–14 and Comparative Examples C–J

Figure 13A:
FIG. 13A shows the flat glass substrate wet-out capability of one embodiment of the present invention, along with the wet-out capability of three comparative examples 13B, 13C, and 13D.
Figure 14A:
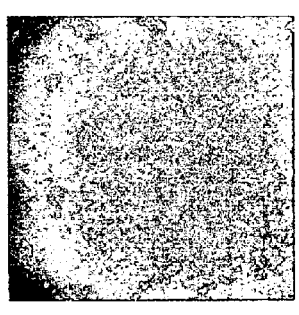
FIGS. 14A and 14B show the six-inch watch glass substrate wet-out capability of one embodiment of the present invention, while 14C and 14D show the eight-inch watch glass substrate wet-out capability of one embodiment of the present invention.
Figure 15A:
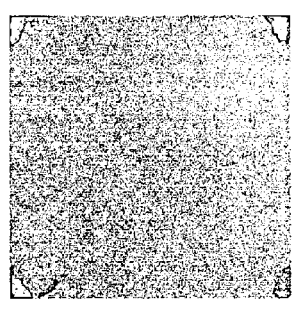
FIGS. 15A and 15B show the six-inch watch glass substrate wet-out capability of comparative example heat sinks, while 15C and 15D show the eight-inch watch glass substrate wet-out capability of comparative example heat sinks.
Figure 13B:
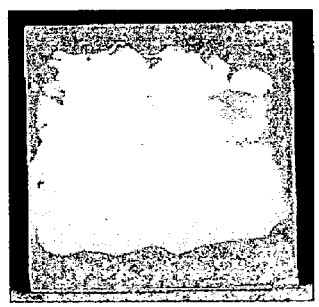
Figure 14B:
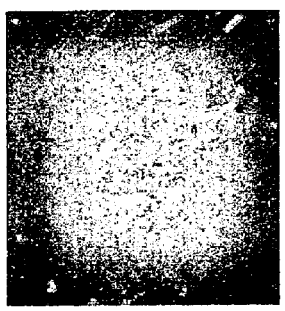
Figure 15B:
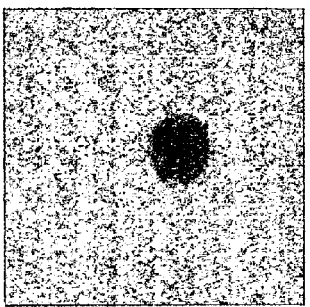
Figure 13C:
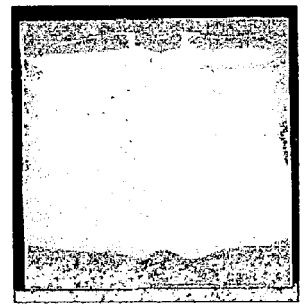
Figure 14C:
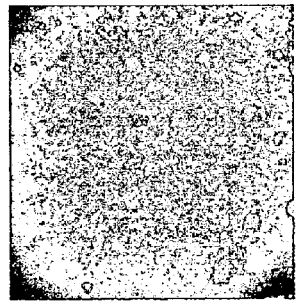
Figure 15C:
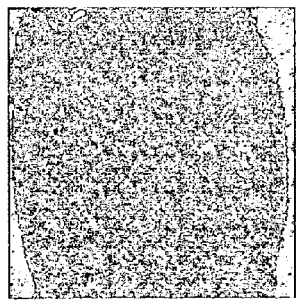
Figure 13D:
Figure 14D:
Figure 15D:

Wet-out Capability was evaluated as described above using flat glass and two watch glass test substrates along with 8805 adhesive. The first was a small watch glass, a 6-inch (150 mm) watch glass (Shallow Form Watch Glass, concave, clear, annealed soda lime glass covers with fire-polished edges, available as catalog number 66112-209, from VWR Scientific Products, Minneapolis, Minn.), and the second was a large watch glass, an 8-inch (200 mm) watch glass (VWR catalog number 66112-242). The convex and concave sides of each size watch glass were used. The flexible heat sink of Example 10 and Comparative Examples C through E had dimensions of about 38×38 mm. The flexible heat sink of the invention having dimensions of 27 mm×27 mm with a post height of 6.5 mm was tested in Examples 11–14, and a commercially available aluminum heat sink (27 mm×27 mm with a pin height of 10 mm) was used for Comparative Examples F through J. The results are shown in the table below, and in FIGS. 13–15. FIG. 13A can be compared with aluminum heat sinks shown in FIGS. 13B–D. FIG. 14A (invention) can be compared with FIG. 15A (conventional), and similarly, the B, C, and D subparts of FIGS. 14 and 15 can be compared. FIG. 14C is shown with ¼ tone enhanced contrast to improve the image, which did not significantly change the wet-out percent. Comparing the numbers in the table and/or the figures dramatically shows the wet-out advantage of the invention.

TABLE 6

Wet-out Capability

| Example | Figure | Substrate | Curvature | Wet-out |
|---|---|---|---|---|
| 10 | 13A | Flat glass | n/a | 88.9 |
| C | 13B | Flat glass | n/a | 33.5 |
| D | 13C | Flat glass | n/a | 21.4 |
| E | 13D | Flat glass | n/a | 35.4 |
| 11 | 14A | small watch glass | concave | 94.2 |
| F | 15A | small watch glass | concave | 2.1 |
| 12 | 14B | small watch glass | convex | 94.8 |
| G | 15B | small watch glass | convex | 4.6 |
| 13 | 14C | large watch glass | concave | 97.2 |
| H | 15C | large watch glass | concave | 10.4 |
| 14 | 14D | large watch glass | convex | 97.8 |
| J | 15D | large watch glass | convex | 33.1 |

Various modifications and alterations of this invention will become apparent to those skilled in the art without departing from the scope and principles of this invention, and it should be understood that this invention is not to be unduly limited to the illustrative embodiments set forth hereinabove. All publications and patents are herein incorporated by reference to the same extent as if each individual publication or patent was specifically and individually indicated to be incorporated by reference.

We claim:

1. A flexible heat sink article comprising:

a base comprising a polymer;

a plurality of polymeric protrusions extending away from the base, each protrusion having a major dimension and a minor dimension; and a thermal interface material contiguous with the base, wherein the polymer of the base comprises thermally conductive particles, wherein the polymer of the protrusions comprises non-spherical thermally conductive particles substantially aligned in the direction of the major dimension within the protrusions, wherein the thermal interface material is provided in two or more intermittent regions and includes two or more of a pressure sensitive adhesive, hot melt adhesive, low surface energy adhesive, epoxy, thermal bond film, phase change material, grease, and eutectic alloy phase change material, wherein the thermal interface material, and wherein the heat sink flexibility allows bending to a radius of less than about 30 cm at room temperature without significantly adversely affecting the heat sink function.

2. The article of claim 1 wherein the thermal interface material comprises caliper variations.

3. The article of claim 2 wherein the caliper variations are selected to improve one or more properties selected from heat flow, adhesion, surface wet-out, contact area, and flexibility.

4. The article of claim 1 wherein the thermally conductive particles are selected from carbon black, carbon fibers, coated carbon fibers, diamond, ceramic fiber mesh, ceramics, boron nitride, aluminum oxide, silicon carbide, aluminum nitride, aluminum trihydrate, magnesium hydroxide, metals, metal foils, and combinations thereof.

5. The article of claim 1 further comprising a metallic layer, a scrim, or a combination thereof, selected to reduce at least one of EMI, RFI, and thermal conductivity, said scrim optionally selected from nickel or nickel-coated scrims, carbon scrims, nickel-coated carbon scrims, and combinations thereof.

6. The article of claim 1 wherein the thermal interface material comprises an electrically conductive adhesive.

7. The article of claim 6 wherein the adhesive further comprises thermally conductive particles of sufficient size to increase thermally conductivity as compared to the adhesive without thermally conductive particles between a substrate and the heat sink article, optionally wherein the particles are contained within the adhesive and impinge the base and optionally impinge the surface of the adhesive opposite the base.

* * * * *

UNITED STATES PATENT AND TRADEMARK OFFICE
CERTIFICATE OF CORRECTION

PATENT NO. : 6,919,504 B2
DATED : July 19, 2005
INVENTOR(S) : McCutcheon, Jeffrey W.

It is certified that error appears in the above-identified patent and that said Letters Patent is hereby corrected as shown below:

Title page,
Item [56], References Cited, OTHER PUBLICATIONS, "Segal et al." reference, after "Sink" delete "." and insert -- , --.

Column 7,
Line 21, delete "crosssection" and insert -- cross-section --.

Column 8,
Line 23, delete "through holes" and insert -- through-holes --.
Line 58, after "33" insert -- , --.

Column 24,
Line 51, delete "beat" and insert -- heat --.

Column 28,
Line 15, delete "arc" and insert -- are --.

Signed and Sealed this

First Day of November, 2005

JON W. DUDAS
*Director of the United States Patent and Trademark Office*